US012628385B2

(12) United States Patent
Chen et al.

(10) Patent No.: US 12,628,385 B2
(45) Date of Patent: May 12, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Kaochao Chen, Hsinchu City (TW); Chia-Cheng Ho, Hsinchu City (TW); Chia-Jui Lee, Hsinchu County (TW); Chia-Yu Wei, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 460 days.

(21) Appl. No.: 18/301,571

(22) Filed: Apr. 17, 2023

(65) Prior Publication Data

US 2024/0145533 A1     May 2, 2024

Related U.S. Application Data

(60) Provisional application No. 63/381,679, filed on Oct. 31, 2022.

(51) Int. Cl.
  H10D 30/01         (2025.01)
  H10D 30/60         (2025.01)
          (Continued)

(52) U.S. Cl.
  CPC ....... H10D 62/109 (2025.01); H10D 30/0221 (2025.01); H10D 30/0281 (2025.01);
          (Continued)

(58) Field of Classification Search
  CPC ............. H10D 30/0221; H10D 30/603; H10D 64/111; H10D 64/112; H10D 64/516
  See application file for complete search history.

(56) References Cited

U.S. PATENT DOCUMENTS 10,971,624 B2    4/2021  Wang et al.
11,056,587 B2    7/2021  Shin et al.
          (Continued)

FOREIGN PATENT DOCUMENTS

TW        201939744 A      10/2019
TW        201941428 A      10/2019
TW        202105745 A       2/2021

*Primary Examiner* — Daniel P Shook
(74) *Attorney, Agent, or Firm* — Harrity & Harrity, LLP

(57) ABSTRACT

A high voltage transistor may include a stepped dielectric layer between a field plate structure and a channel region of the high voltage transistor in a substrate. The stepped dielectric layer may increase the breakdown voltage of the high voltage transistor by reducing the electric field strength near the drain region of the high voltage transistor. In particular, a portion of the stepped dielectric layer near the drain region includes a thickness that is greater relative to a thickness of another portion of the stepped dielectric layer near the gate structure. The increased thickness near the drain region provides increased electric field suppression near the drain region (which operates at high voltages). In this way, the stepped dielectric layer enables the high voltage transistor described herein to achieve higher break-down voltages without increasing the distance between the gate structure and the drain region of a high voltage tran-sistor.

20 Claims, 25 Drawing Sheets

300 ⟶

(51) Int. Cl.
    H10D 30/65     (2025.01)
    H10D 62/10     (2025.01)
    H10D 64/00     (2025.01)
    H10D 64/27     (2025.01)

(52) U.S. Cl.
    CPC ....... H10D 30/0285 (2025.01); H10D 30/603 (2025.01); H10D 30/65 (2025.01); H10D 64/111 (2025.01); H10D 64/112 (2025.01); H10D 64/516 (2025.01)

(56)            References Cited

U.S. PATENT DOCUMENTS

| | | |
|---|---|---|
| 2009/0230430 A1 | 9/2009 | Miyamoto et al. |
| 2014/0042522 A1* | 2/2014 | Li ........................ H01L 29/402 |
| | | 438/286 |
| 2021/0111254 A1 | 4/2021 | Jones et al. |
| 2021/0328028 A1* | 10/2021 | Chen ................... H10D 30/015 |

* cited by examiner

200

700

300

202

900

910 — Form a gate structure over a substrate of a semiconductor device

920 — Form a first source/drain region in the substrate

930 — Form a second source/drain region in the substrate

940 — Form a dielectric layer over the substrate between the gate structure and the second source/drain region 950 — Form a masking layer over a portion of the dielectric layer 960 — Etch the dielectric layer based on the masking layer 970 — Remove the masking layer after etching the dielectric layer based on the masking layer 980 — Form a field plate layer that extends along the dielectric layer after removing the masking layer

FIG. 9

SEMICONDUCTOR DEVICE AND METHODS OF FORMATION

CROSS-REFERENCE TO RELATED APPLICATION

This Patent Applications claims priority to U.S. Provisional Patent Application No. 63/381,679, filed on Oct. 31, 2022, and entitled "SEMICONDUCTOR DEVICE AND METHODS OF FORMATION." The disclosure of the prior Application is considered part of and is incorporated by reference into this Patent Application.

BACKGROUND

A high voltage transistor is a type of metal oxide semiconductor (MOS) transistor may be configured to operate at a higher drain voltage relative to a low voltage transistor. Low voltage transistors may be used in applications such as logic circuits (e.g., processors), memory (e.g., static random access memory (SRAM), and/or input/output (I/O) circuits, among other examples. High voltage transistors may be used in applications such as integrated circuit (IC) drivers, power ICs, image sensors, power management, display driver ICs (DDICs), bipolar complementary metal oxide semiconductor (CMOS) diffused metal oxide semiconductor (DMOS) ICs (BCD ICs), and/or image signal processing (ISP) ICs, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart of an example process associated with forming a semiconductor device described herein.

DETAILED DESCRIPTION

Figure 1:
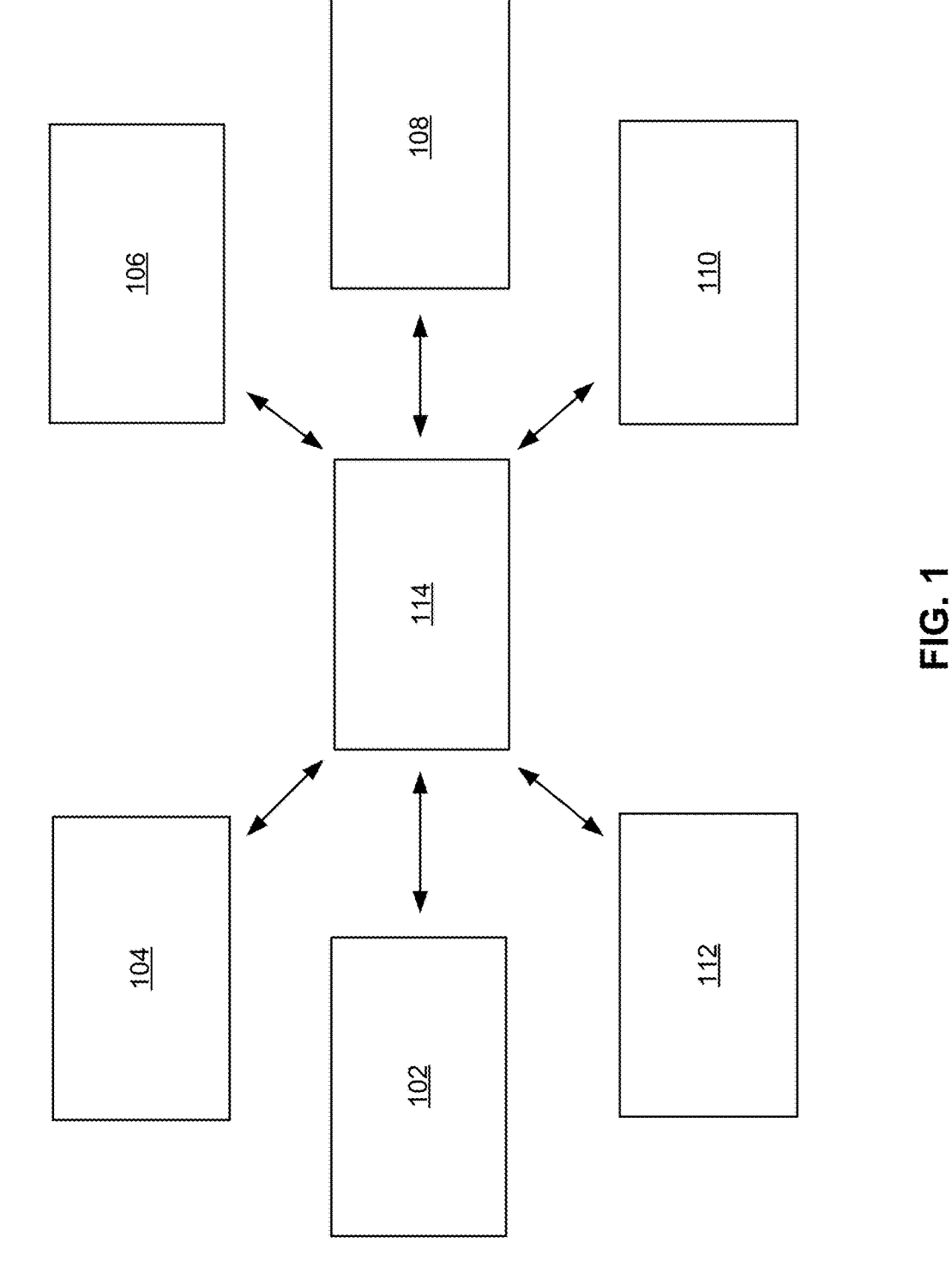
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To operate at higher drain voltages, a high voltage transistor may be manufactured to withstand a high breakdown voltage. Breakdown voltage is a voltage at or near which a transistor ceases to operate according to the intended operating principles of the transistor. In a high voltage transistor, gate-to-drain voltages may sometimes satisfy or exceed the breakdown voltage of the high voltage transistor due to the high grain voltages experienced by the high voltage transistor.

In some cases, a distance between a gate structure and a drain region of a high voltage transistor may be increased to increase the breakdown voltage (BV) of the high voltage transistor. However, increasing the distance between the gate structure and the drain region increases the footprint of the high voltage transistor. The increased footprint may reduce the operating efficiency of the high voltage transistor, may increase resistance in the high voltage transistor, and/or may result in reduced density of high voltage transistors in a semiconductor device, among other examples.

In some implementations described herein, a high voltage transistor includes a field plate (e.g., a metal field plate (MFP)) layer. A field plate layer is a conductive layer that is included over a portion of a channel region of the high voltage transistor between a gate structure and a drain region of the high voltage transistor. The field plate layer may increase the performance of the high voltage transistor by manipulating electric fields (e.g., reducing peak electric fields) generated by a gate structure of the high voltage transistor. By manipulating the electric field generated by the gate structure, the high voltage transistor can achieve increased breakdown voltages.

As further disclosed herein, the high voltage transistor may include a stepped dielectric layer between the field plate structure and the channel region of the high voltage transistor. The stepped dielectric layer may further increase the breakdown voltage of the high voltage transistor by reducing the electric field strength near the drain region of the high voltage transistor. In particular, a portion of the stepped dielectric layer near the drain region includes a thickness that is greater relative to a thickness of another portion of the stepped dielectric layer near the gate structure. The increased thickness near the drain region provides increased electric field suppression near the drain region (which operates at high voltages). In this way, the stepped dielectric layer enables the high voltage transistor described herein to achieve higher breakdown voltages without increasing the distance between the gate structure and the drain region of a high voltage transistor. This enables the performance of the high voltage transistor to be increased while enabling increased density of high voltage transistors in a semiconductor device.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a first source/drain region in the substrate, where the first source/drain region is on a first side of the gate structure. One or more of the semiconductor processing tools 102-112 and/or the wafer/ die transport tool 114 may form a second source/drain region in the substrate, where the second source/drain region is on a second side of the gate structure opposing the first side. One or more of the semiconductor processing tools 102-112 and/or the wafer/die transport tool 114 may form a dielectric layer over the substrate between the gate structure and the second source/drain region. One or more of the semiconductor processing tools 102-112 and/or the wafer/die transport tool 114 may form a masking layer over a portion of the dielectric layer. One or more of the semiconductor processing tools 102-112 and/or the wafer/die transport tool 114 may etch the dielectric layer based on the masking layer, where the masking layer protects the portion of the dielectric layer from being etched, and where etching the dielectric layer based on the masking layer results in the portion of the dielectric layer being a raised portion that is located between non-raised portions of the dielectric layer. One or more of the semiconductor processing tools 102-112 and/or the wafer/die transport tool 114 may remove the masking layer after etching the dielectric layer based on the masking layer. One or more of the semiconductor processing tools 102-112 and/or the wafer/die transport tool 114 may form a field plate layer that extends along the dielectric layer after removing the masking layer. One or more of the semiconductor processing tools 102-112 and/or the wafer/die transport tool 114 may perform other operations described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
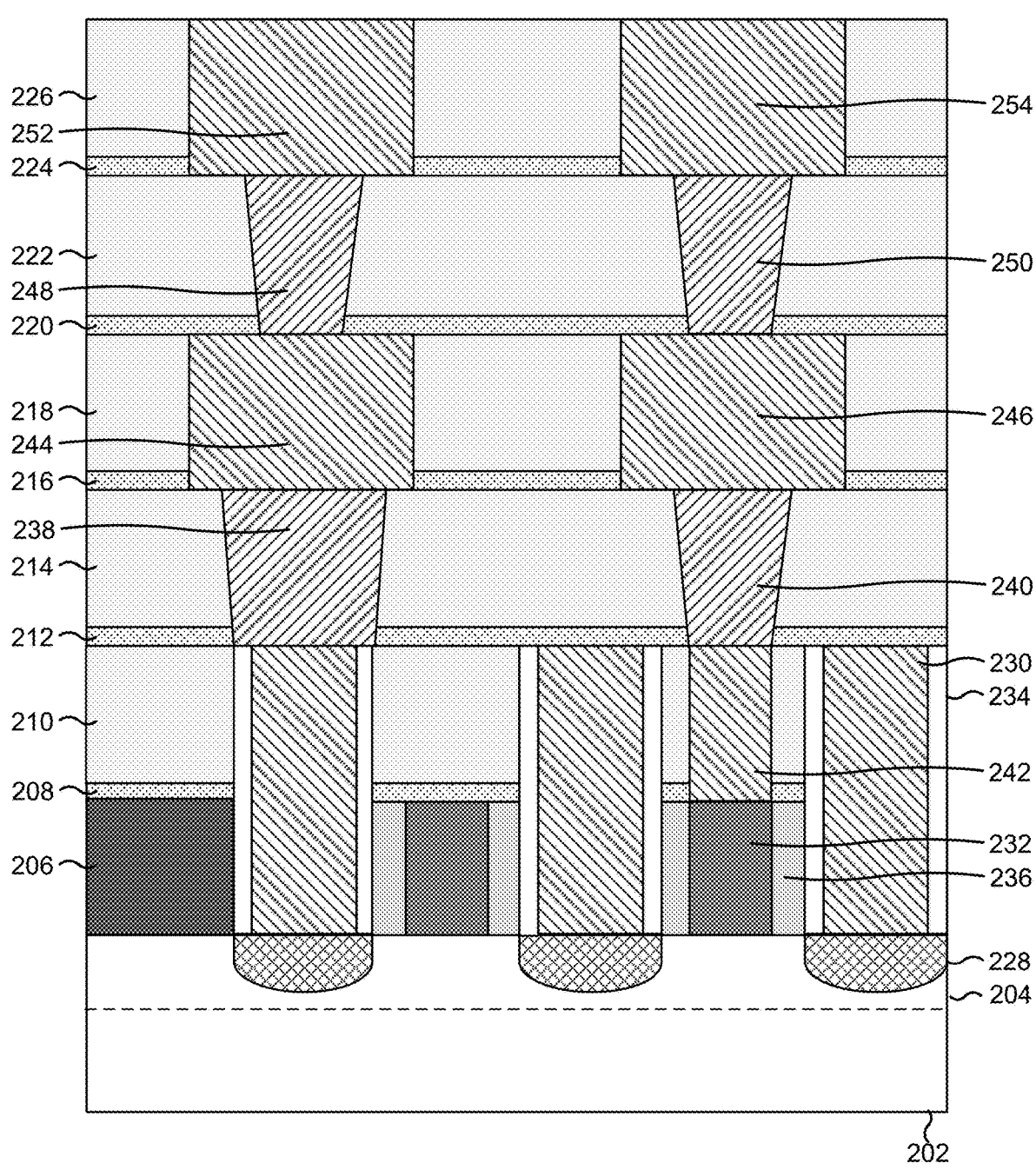
FIG. 2 is a diagram of a portion of an example device described herein.

FIG. 2 is a diagram of a portion of an example device 200 described herein. Device 200 includes an example of a memory device (e.g., a static random access memory (SRAM), a dynamic random access memory (DRAM)), a logic device, a processor, an input/output device, or another type of semiconductor device that includes one or more transistors.

The device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200.

As further shown in FIG. 2, the device 200 includes a plurality of source/drain regions 228. Source/drain region(s) may refer to a source or a drain, individually or collectively dependent upon the context. The source/drain regions 228 may include epitaxial (epi) regions that are grown and/or otherwise formed on and/or around portions of the fin structure 204. The source/drain regions 228 may be formed by epitaxial growth and/or another processing technique. In some implementations, the source/drain regions 228 are formed in recessed portions in the fin structure 204. The recessed portions may be formed by strained source drain (SSD) etching of the fin structure 204 and/or another type etching operation. The source/drain regions 228 function as source or drain regions of the transistors included in the device 200.

The source/drain regions 228 may include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device 200 may include p-type metal oxide semiconductor (PMOS) transistors that include p-type source/drain regions, n-type metal oxide semiconductor (NMOS) transistors that include n-type source/drain regions, and/or other types of transistors.

The source/drain regions 228 are electrically connected to source/drain contacts 230 of the transistors included in the device 200. The source/drain contacts (metal source/drains (MDs)) 230 include cobalt (Co), ruthenium (Ru), and/or another conductive or metal material. The transistors further include gate structures 232 (main gates (MGs)), which are formed of a polysilicon material, a metal (e.g., tungsten (W) or another metal), and/or another type of conductive material. The source/drain contacts 230 and the gate structures 232 are electrically isolated by one or more sidewall spacers, including sidewall spacer layers 234 in each side of the source/drain contacts 230 and sidewall spacer layers 236 on each side of the gate structures 232. The sidewall spacer layers 234 and 236 include a silicon oxide ($SiO_x$), a silicon nitride ($Si_xN_y$), a silicon oxy carbide (SiOC), a silicon oxycarbonitride (SiOCN), and/or another suitable material.

In some implementations, the sidewall spacer layers 234 are omitted from the sidewalls of the source/drain contacts 230.

As further shown in FIG. 2, the source/drain contacts 230 and the gate structures 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The source/drain contacts 230 are electrically connected to source/drain interconnects 238 (e.g., source/drain vias or VDs). One or more of the gate structures 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gate structures 232 are electrically connected to the gate interconnects 240 by gate contacts 242 (CB or MP) to reduce contact resistance between the gate structures 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 includes additional metallization layers and/or vias that connect the device 200 to a package.

As indicated above, FIG. 2 is provided as an example. Other examples may differ from what is described with regard to FIG. 2.

Figure 3:
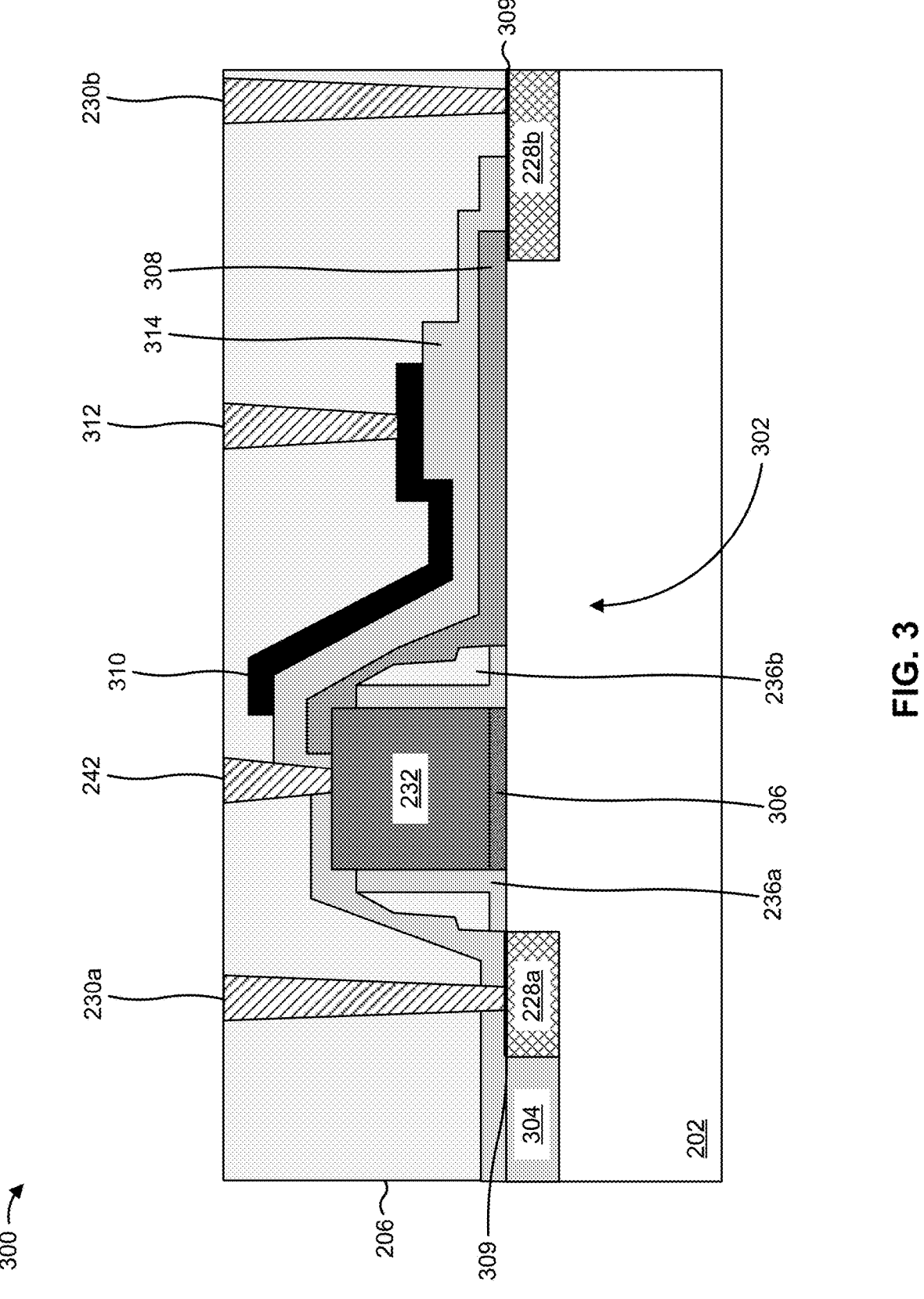
FIG. 3 is a diagram of an example semiconductor device described herein.

FIG. 3 is a diagram of an example semiconductor device 300 described herein. The semiconductor device 300 may include a transistor that is included in the device 200 described in connection with FIG. 2. The semiconductor device 300 may include a high voltage transistor, such as a high voltage planar transistor, a high voltage fin field effect transistor (FinFET), a high voltage nanostructure transistor (e.g., a gate all around (GAA) transistor, a nanosheet transistor, a nanotube transistor, a nanoribbon transistor), a high voltage laterally diffused metal oxide semiconductor (LDMOS) transistor, and/or another type of high voltage transistor.

As shown in FIG. 3, the semiconductor device 300 may include (or may be included in) the substrate 202 of the device 200. The semiconductor device 300 may include a source/drain region 228a in the substrate 202, and a source/drain region 228b included in the substrate 202. In some implementations, the source/drain region 228a is a source region of the semiconductor device 300 and the source/drain region 228b is a drain region of the semiconductor device 300 that is configured to operate at a relatively high voltage. As an example, the source/drain region 228b may operate at a drain voltage that is included in a range of approximately 5 volts to approximately 24 volts, whereas a low-voltage transistor might operate in a drain voltage range of approximately 0 volts to approximately 1.8 volts. However, other values for these ranges are within the scope of the present disclosure. In some implementations, the source/drain region 228b is a source region of the semiconductor device 300 and the source/drain region 228a is a drain region of the semiconductor device 300 that is configured to operate a relatively high voltage.

A region of the substrate 202 between the source/drain region 228a and the source/drain region 228b may be referred to as a channel region (or active region) 302 of the semiconductor device 300. The channel region 302 includes one or more semiconductor materials such that the conductivity of the channel region 302 that may be selectively controlled using an electric field. In this way, an electrical current may selectively flow between the source/drain region 228a and the source/drain region 228b based the conductivity of the channel region 302.

One or more isolation regions (e.g., shallow trench isolation (STI) regions) 304 may be included in the substrate 202. The one or more isolation regions 304 may electrically isolate active regions of adjacent semiconductor devices 300. The one or more isolation regions 304 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The one or more isolation regions 304 may include a multi-layer structure, for example, having one or more liner layers.

A gate structure 232 may be included over the substrate 202 between the source/drain region 228a and the source/drain region 228b. A voltage may be selectively applied to the gate structure 232 to selectively control the conductivity of the channel region 302 in the substrate 202. A gate dielectric layer 306 may be included on the substrate 202 between the substrate 202 and the gate structure 232. The gate dielectric layer 306 may provide electrical isolation between the gate structure 232 and the substrate 202, which enables a voltage applied to the gate structure 232 to cause an electric field to be generated in the substrate 202. The gate dielectric layer 306 may include a dielectric oxide layer and/or another suitable dielectric layer. The dielectric oxide layer may be formed by chemical oxidation, thermal oxidation, ALD, CVD, and/or other suitable methods.

One or more sidewall spacer layers 236 may be included over and/or on sidewalls of the gate structure 232. Seal spacer layers 236a may be included on the sidewalls of the gate structure 232. The seal spacer layers 236a may be conformally deposited (e.g., by the deposition tool 102) and may include a silicon oxycarbide (SiOC), a nitrogen free SiOC, or another suitable material. The seal spacer layers 236a may be formed by an ALD operation in which various types of precursor gasses including silicon (Si) and carbon (C) are sequentially supplied in a plurality of alternating cycles to form the seal spacer layers 236a, among other example deposition techniques.

Bulk spacer layers 236b may be formed on the seal spacer layers 236a. The bulk spacer layers 236b may be formed of similar materials as the seal spacer layers 236a. However, the bulk spacer layers 236b may formed without plasma surface treatment that is used for the seal spacer layers 236a. Moreover, the bulk spacer layers 236b may be formed to a greater thickness relative to the thickness of the seal spacer layers 236a.

In some implementations, the seal spacer layers 236a and the bulk spacer layers 236b are conformally deposited (e.g., by the deposition tool 102) on the gate structure 232 and/or on the substrate 202. The seal spacer layers 236a and the bulk spacer layers 236b are patterned (e.g., by the deposition tool 102, the exposure tool 104, and the developer tool 106) and etched (e.g., by the etch tool 108) to remove the seal spacer layers 236a and the bulk spacer layers 236b from the tops of the gate structure 232 and from the substrate 202.

A blocking layer 308 may be included over and/or on the substrate 202 between the gate structure 232 and the source/drain region 228b. In some implementations, the blocking layer 308 is included over a sidewall of the gate structure 232 and/or over a portion of a top surface of the gate structure 232. In these implementations, the blocking layer 308 may include an angled portion along the sidewall of the gate structure 232 or sidewall of the seal spacer layers 236a. The angled portion of the blocking layer 308 may conform to the shape of the sidewall spacer layer(s) 236 over the sidewall of the gate structure 232, such as the seal spacer layer 236a and/or the bulk spacer layer 236b.

The blocking layer 308 may include a resist-protection oxide (RPO) layer configured to prevent silicide formation on the substrate 202, on the gate structure 232, and/or on another surface of the semiconductor device 300. The blocking layer 308 may continuously extend along the substrate 202 between the gate structure 232 and the source/drain region 228b. In some implementations, the blocking layer 308 extends over a portion of the source/drain region 228b. The source/drain region 228a and the source/drain region 228b are exposed through the blocking layer 308 to enable a metal silicide layer 309 to be formed on the source/drain region 228a and on the source/drain region 228b in preparation for forming source/drain contacts 230 on the source/drain region 228a and on the source/drain region 228b. The blocking layer 308 may include one or more dielectric materials, such as an oxide (e.g., SiO), such as $SiO_2$), a nitride (e.g., $Si_xN_y$, such as $Si_3N_4$), a carbide, an oxynitride, an oxycarbide, and a nitride carbide, an polymer, the like, and/or another suitable dielectric material.

A field plate layer (e.g., a metal field plate (MFP)) 310 may be included over the blocking layer 310 between the gate structure 232 and the source/drain region 228b. The field plate layer 310 may include a layer of conductive material. Examples of conductive materials for the field plate layer 310 include copper (Cu), gold (Au), silver (Ag), nickel (Ni), tin (Sn), ruthenium (Ru), cobalt (Co), tungsten (W), titanium (Ti), one or more metals, one or more conductive ceramics, one or more metal alloys, and/or another type of electrically conductive material.

The field plate layer 310 may be included to increase the performance of the semiconductor device 300 by manipulating the electric fields generated by a gate structure 232. The field plate layer 310 may be shorted to the gate structure 232, may be shorted to the source/drain region 228a, and/or may be electrically connected to another structure in the semiconductor device 300. A bias voltage may be applied to the field plate layer 310 through a field plate contact 312 to reduce the peak electric field strength generated by the gate structure 232 in the channel region 302 of the substrate 202. The bias voltage increases carrier depletion in the channel region 302, thereby reducing the peak electric field strength in the channel region 302. By manipulating the electric field generated by the gate structure 232, the semiconductor device 300 can achieve increased breakdown voltages.

A dielectric layer 314 may be included between the substrate 202 and the field plate layer 310. In particular, the dielectric layer 314 may be included over the substrate 202, and over and/or on the blocking layer 308. In some implementations, a portion of the dielectric layer 314 is included over and/or on a portion of the source/drain region 228b. In some implementations, a portion of the dielectric layer 314 extends along one or more sidewalls of the gate structure 232. In these implementations, the dielectric layer 314 may be include on the one or more sidewall spacer layers 236 (e.g., on the seal spacer layers 236a, on the bulk spacer layers 236b). In some implementations, a portion of the dielectric layer 314 is included over and/or on a portion of the source/drain region 228a. In some implementations, a portion of the dielectric layer 314 is included over and/or on a portion of one or more isolation regions 304.

The dielectric layer 314 may include a stepped dielectric layer that is included to further increase the breakdown voltage of the semiconductor device 300 by reducing the electric field strength in the channel region 302 of the substrate 202 near the source/drain region 228b. In particular, a portion of the dielectric layer 314 near the source/drain region 228b includes a thickness that is greater relative to a thickness of other portions of the dielectric layer 314. The increased thickness near the source/drain region 228b provides increased electric field suppression near the source/drain region 228b. For example, the stepped configuration of the dielectric layer 314 may achieve an approximately 20% increase or greater in breakdown voltage the semiconductor device 300 relative to if the dielectric layer 314 is not included in the semiconductor device 300. As another example, the stepped configuration of the dielectric layer 314 may achieve a breakdown voltage the semiconductor device 300 of approximately 48 volts relative to approximately 38 volts if the dielectric layer 314 is not included in the semiconductor device 300. However, other values are within the scope of the present disclosure.

In some implementations, the dielectric layer 314 includes a polymer, one or more fillers dispersed in a resin, an epoxy-based resin, and/or another type of insulating material. In some implementations, the dielectric layer 314 includes a dielectric material such as a silicon oxide (SiO), such as $SiO_2$), a spin-on glass (SOG), a nitride (e.g., a silicon nitride ($Si_xN_y$)), a carbide (e.g., a silicon carbide (SiC)), an oxynitride (e.g., a silicon oxynitride (SiON)), an oxycarbide (e.g., a silicon oxycarbide (SiOC)), a nitride carbide, and/or another suitable dielectric material. In some implementations, the dielectric layer 314 includes a polymer material such as polybenzoxazole (PBO), a polyimide, a low temperature polyimide (LTPI), an acrylic reason, a phenol resin, and/or benzocyclobutene (BCB), among other examples.

As further shown in FIG. 3, the semiconductor device 300 may be included on one or more of the dielectric layers of the device 200, such as the dielectric layer 206. In some implementations, other layers, such as and the dielectric layer 210 and/or the ESL 208 may be included. A source/drain contact 230a may be included in the one or more dielectric layers and may be electrically connected and/or physically connected with the source/drain region 228a. A source/drain contact 230b may be included in the one or more dielectric layers and may be electrically connected and/or physically connected with the source/drain region 228b. A gate contact 242 may be included in the one or more dielectric layers and may be electrically connected and/or physically connected with the gate structure 232.

As indicated above, FIG. 3 is provided as an example. Other examples may differ from what is described with regard to FIG. 3.

Figure 4A:
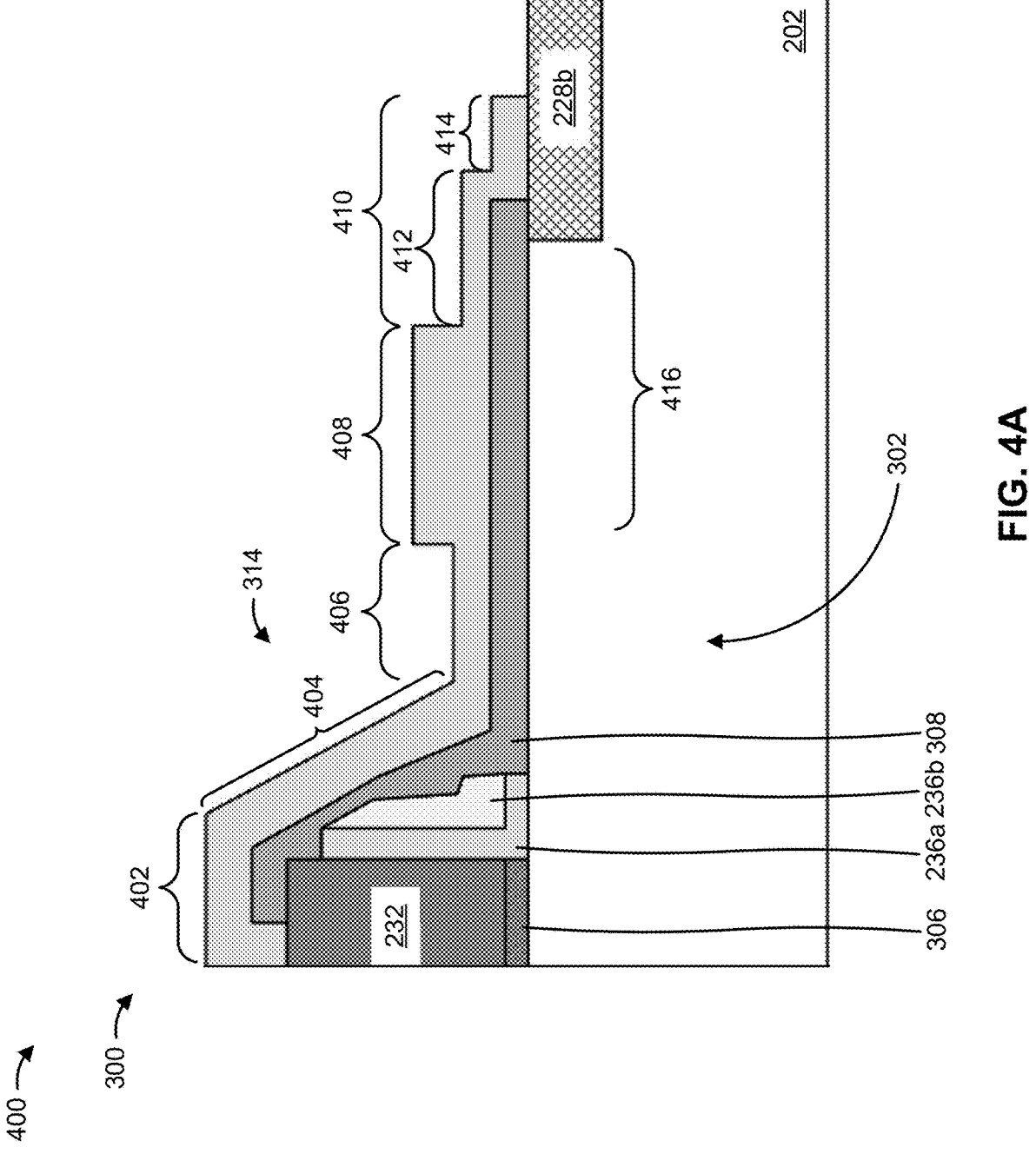
FIGS. 4A and 4B are diagrams of an example implementation of a semiconductor device described herein.
Figure 4B:
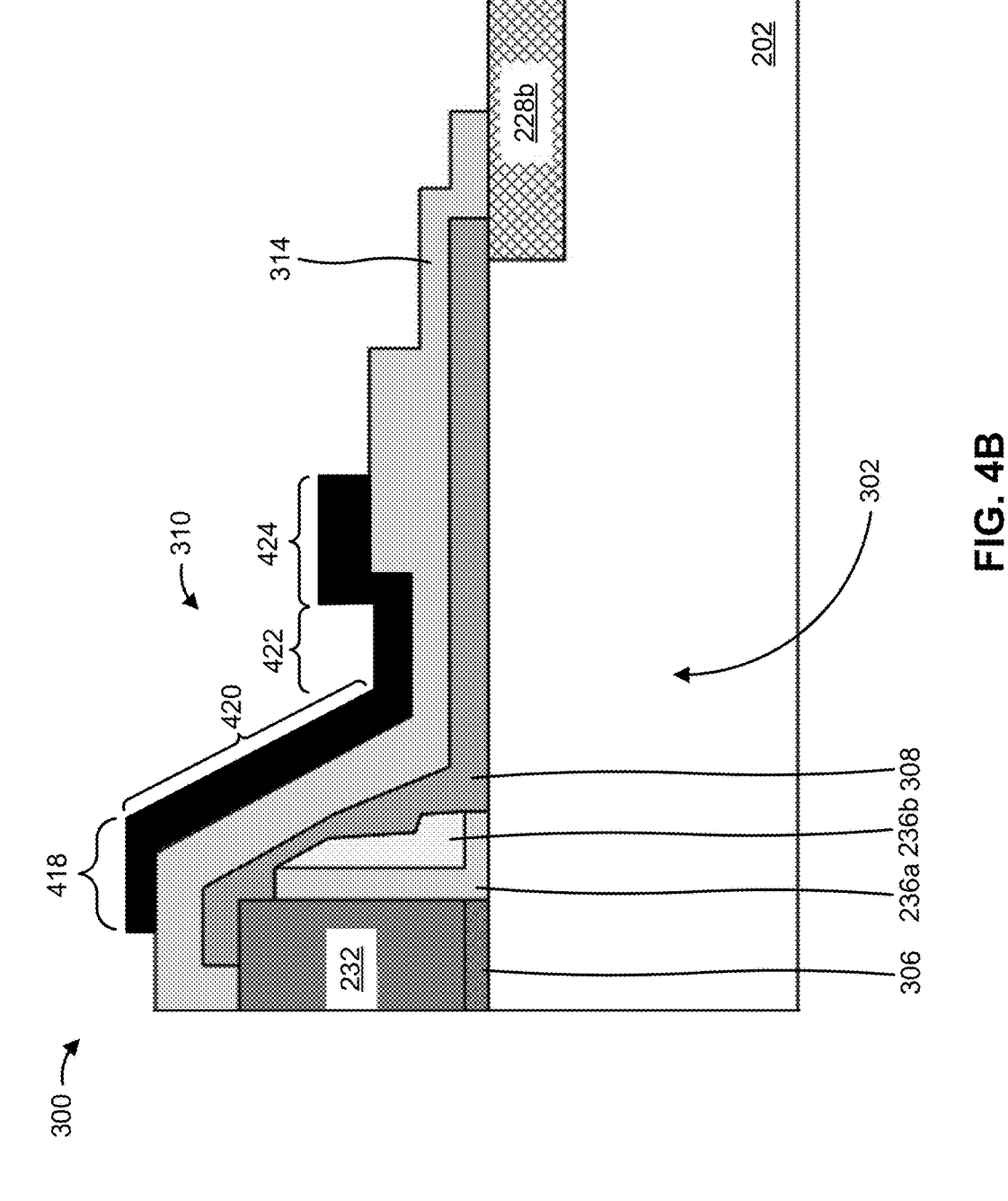

FIGS. 4A and 4B are diagrams of an example implementation 400 of the semiconductor device 300 described herein. In particular, the example implementation 400 includes an example implementation of the dielectric layer 314 and the field plate layer 310 of the semiconductor device 300.

As shown in FIG. 4A, the dielectric layer 314 may include an approximately flat portion 402 over the gate structure 232. The dielectric layer 314 may include an angled portion 404 that extends along a sidewall of the gate structure 232. The angled portion 404 is connected to the flat portion 402 and conforms to the shape or profile of the blocking layer 308 that is on the seal spacer layers 236a and on the bulk spacer layers 236b. The dielectric layer 314 includes a non-raised portion 406 on the blocking layer 308 and over the channel region 302 of the substrate 202. The non-raised portion 406 is connected to the angled portion 404 and is approximately parallel with the substrate 202 (e.g., with the top surface of the substrate 202).

As further shown in FIG. 4A, the dielectric layer 314 includes a raised portion 408. The raised portion 408 is connected to the non-raised portion 406 and is included over and/or on the blocking layer 308 over the channel region 302 of the substrate 202. The raised portion 408 is connected to the non-raised portion 406 at a first side of the raised portion 408. The dielectric layer 314 includes another non-raised portion that is connected to the raised portion 408 at a second side of the raised portion 408 opposing the first side. The other non-raised portion includes a stair stepped portion 410. The stair stepped portion 410 includes one or more stepped portions of the dielectric layer 314, such as stepped portion 412 and a stepped portion 414, among other examples. The quantity of stepped portions illustrated in FIG. 4A is an example, and other quantities of stepped portions are within the scope of the present disclosure.

The stepped portion 412 may be included over and/or on the blocking layer 308. The stepped portion 414 may be included adjacent to the blocking layer 308. The stepped portion 414 may be adjacent to the blocking layer 308, and may be included over and/or on the substrate 202 and/or over and/or on a portion of the source/drain region 228b. In other words, the stepped portion 414 may at least partially extend over the source/drain region 228b. Accordingly, the stair stepped portion 410 may be included on the blocking layer 308, on the substrate 202, on the source/drain region 228b, or a combination thereof.

The stepped portion 412 may have a top surface that is approximately co-planar with the top surface of the non-raised portion 406. The stepped portion 414 may have a top surface that is at a height in the semiconductor device 300 that is less than a height of the top surface of the stepped portion 414. Generally, the heights of the top surfaces of the portions 406, 410, 412, and 414 of the dielectric layer 314 are lesser relative to the height of the top surface of the raised portion 408 as a result of a thickness of the raised portion 408 being greater relative to thicknesses of the portions 406, 410, 412, and 414 of the dielectric layer 314.

As further shown in FIG. 4A, a top surface of the raised portion 408 is at a height in the semiconductor device 300 that is greater relative to a height of non-raised portions (e.g., the non-raised portion 406, the stepped portion 412 and the stepped portion 414 of the stair stepped portion 410) of the dielectric layer 314 that are adjacent to the raised portion 408.

As further shown in FIG. 4A, one or more portions of the dielectric layer 314 may be included over a drift region 416 in the substrate 202. The drift region 416 may include a portion of the channel region 302 that is adjacent to or near the source/drain region 228b. The drift region 416 may also be referred to as a drain extension region, and may include a portion of the substrate 202 that includes a doping type having a relatively low doping concentration, which provides for a greater resistance at increased operating voltages.

As shown in FIG. 4B, the field plate layer 310 conforms to the shape or profile of the dielectric layer 314. In other words, the contours of the field plate layer 310 conform to the contours of the dielectric layer 314. The field plate layer 310 includes an approximately flat portion 418 on the flat portion 402 of the dielectric layer 314. The field plate layer 310 includes an angled portion 420 on the angled portion 404 of the dielectric layer 314. The angled portion 420 is connected to the flat portion 418. The field plate layer 310 includes a non-raised portion 422 on the non-raised portion 406 of the dielectric layer 314. The non-raised portion 422 is connected to the angled portion 420. The field plate layer 310 includes a raised portion 424 on a portion of the raised portion 408 of the dielectric layer 314. The raised portion 424 is connected to the non-raised portion 422. In some implementations, the raised portion 424 extends entirely along the raised portion 408 of the dielectric layer 314.

As indicated above, FIGS. 4A and 4B are provided as an example. Other examples may differ from what is described with regard to FIGS. 4A and 4B.

Figure 5A:
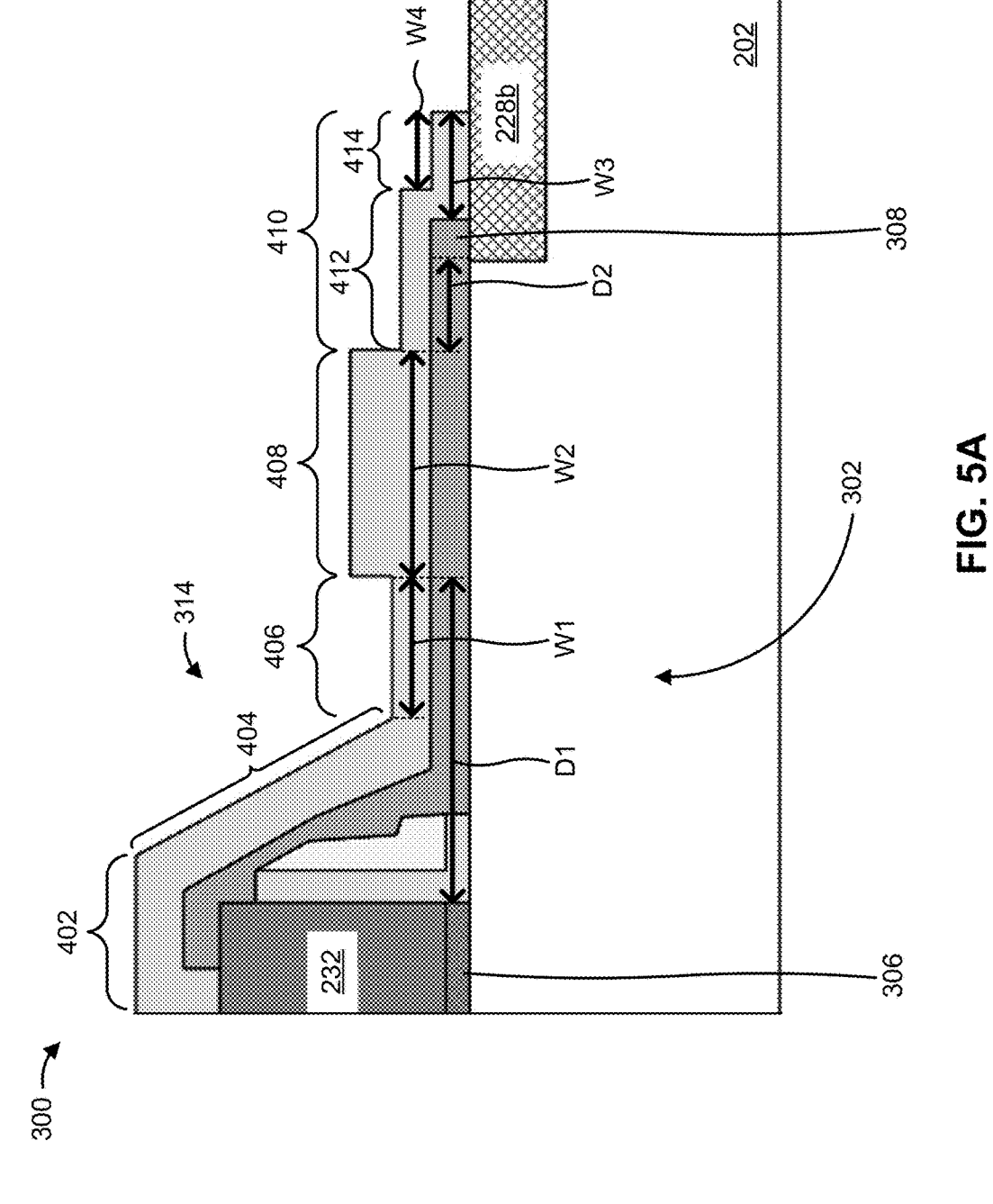
FIGS. 5A-5C are diagrams of an example implementation of a semiconductor device described herein.
Figure 5B:
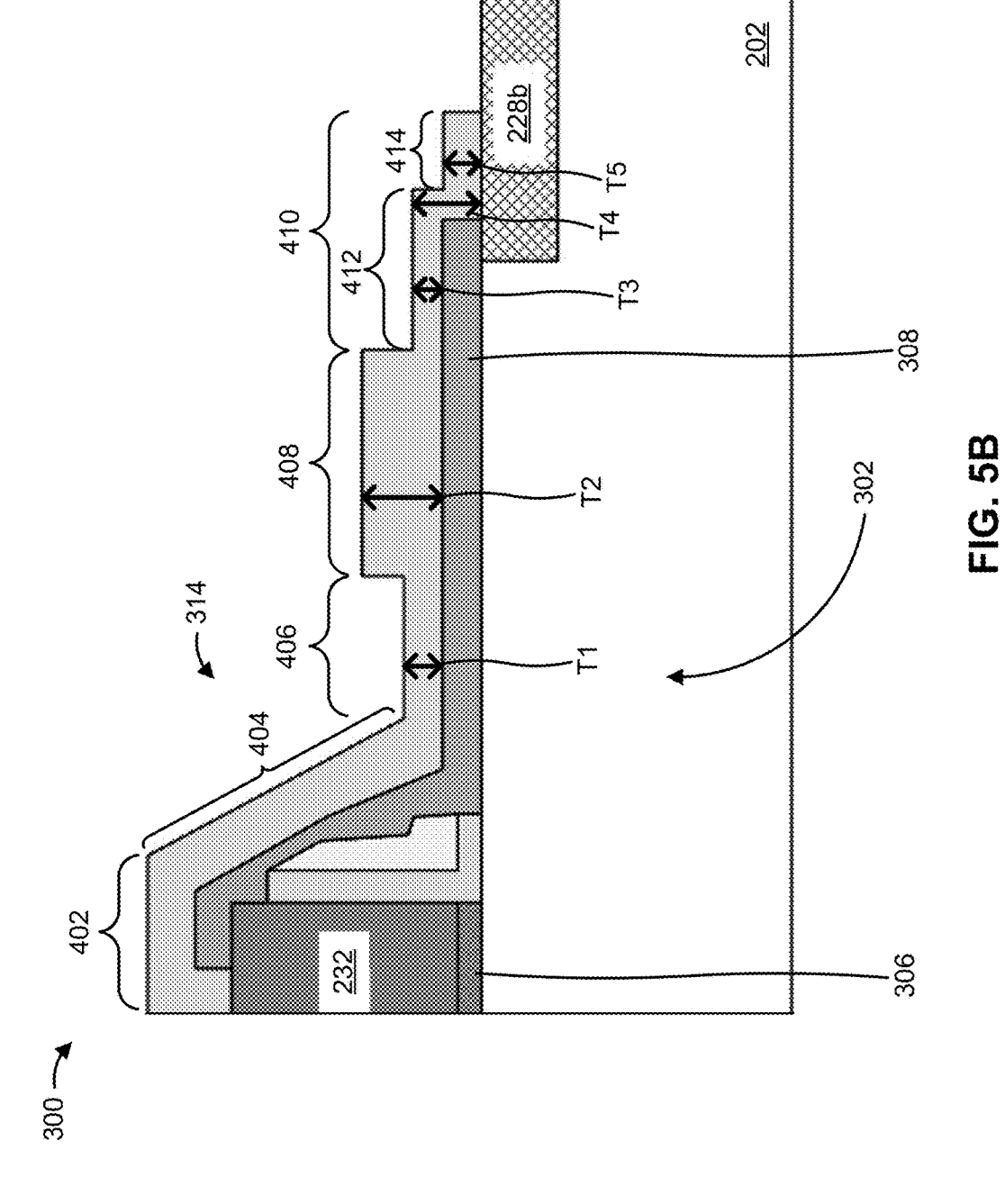
Figure 5C:
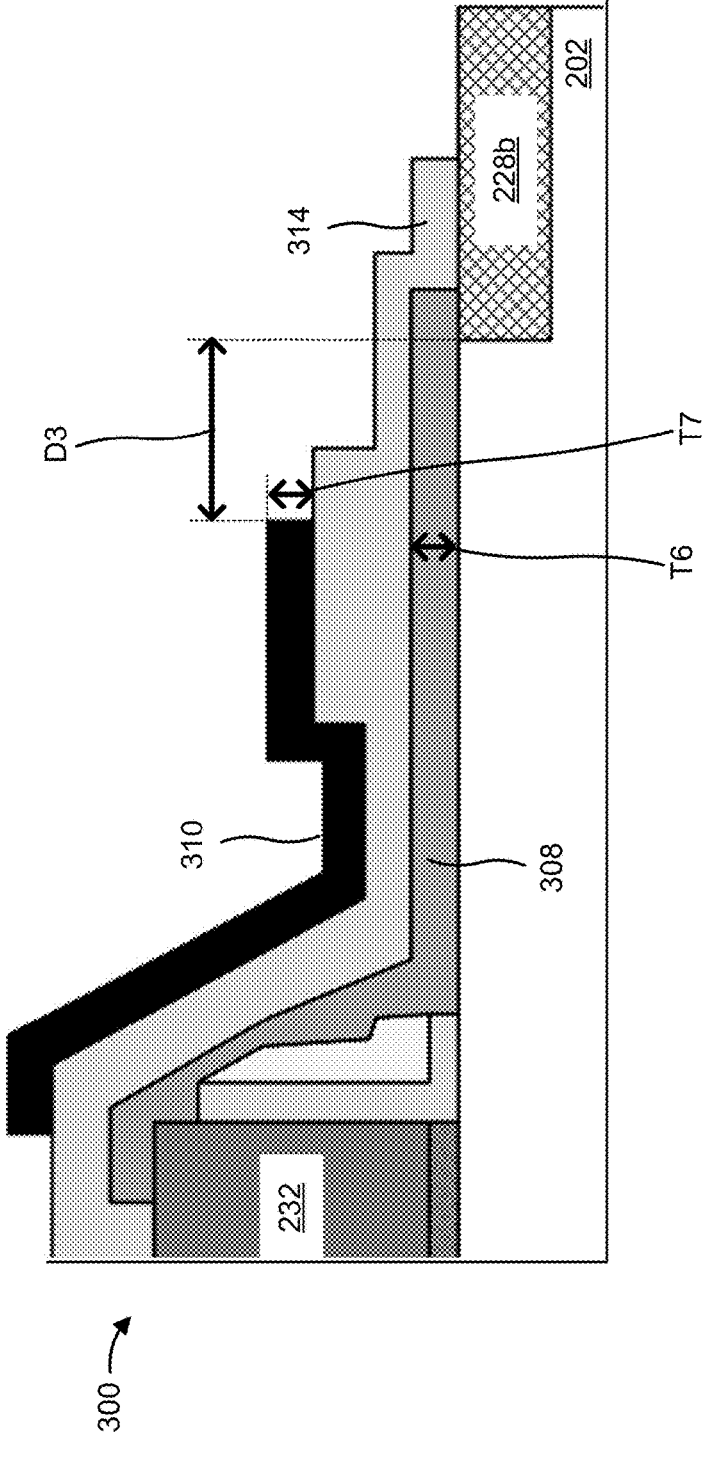

FIGS. 5A-5C are diagrams of an example implementation 500 of the semiconductor device 300 described herein. In particular, the example implementation 500 includes example dimensions of the dielectric layer 314 of the semiconductor device 300.

As shown in FIG. 5A, an example dimension of the semiconductor device 300 includes a distance D1 between an end of the raised portion 408 of the dielectric layer 314 and a sidewall of the gate structure 232. In some implementations, the distance D1 is included in a range of approximately 100 nanometers to approximately 10000 nanometers to reduce process variation in manufacturing the semiconductor device 300 while achieving a sufficiently low drain to source on resistance ($R_{dson}$) for the semiconductor device 300. However, other values for the range are within the scope of the present disclosure.

As further shown in FIG. 5A, an example dimension of the semiconductor device 300 includes a distance D2 between an opposing end of the raised portion 408 of the dielectric layer 314 and an edge of the source/drain region 228b. In some implementations, the distance D2 is included in a range of approximately 50 nanometers to approximately 5000 nanometers to reduce process variation in manufacturing the semiconductor device 300 while achieving a sufficiently low drain to source on resistance ($R_{dson}$) for the semiconductor device 300. However, other values for the range are within the scope of the present disclosure.

As further shown in FIG. 5A, an example dimension of the semiconductor device 300 includes a width W1 of the non-raised portion 406 of the dielectric layer 314. In some implementations, the width W1 is included in a range of approximately 50 nanometers to approximately 5000 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased reduced surface field (RESURF) efficiency, which may enable a higher breakdown voltage for the semiconductor device 300 to be achieved. However, other values for the range are within the scope of the present disclosure.

As further shown in FIG. 5A, an example dimension of the semiconductor device 300 includes a width W2 of the raised portion 408 of the dielectric layer 314. In some implementations, the width W2 is included in a range of approximately 50 nanometers to approximately 5000 nanometers to reduce process variation in manufacturing the semiconductor device 300 while achieving a sufficiently low drain to source on resistance (R dson) for the semiconductor device 300. However, other values for the range are within the scope of the present disclosure.

As further shown in FIG. 5A, an example dimension of the semiconductor device 300 includes a width W3 of a portion of the stair stepped portion 410 adjacent to the blocking layer 308. In some implementations, the width W3 is included in a range of approximately 1 nanometer to approximately 500 nanometers to reduce process variation in manufacturing the semiconductor device 300 while achieving a sufficiently low drain to source on resistance (R$_{dson}$) for the semiconductor device 300. However, other values for the range are within the scope of the present disclosure.

As further shown in FIG. 5A, an example dimension of the semiconductor device 300 includes a width W4 of the stepped portion 414 of the dielectric layer 314. In some implementations, the width W4 is included in a range of approximately 1 nanometers to approximately 500 nanometers to reduce process variation in manufacturing the semiconductor device 300 while achieving a sufficiently low drain to source on resistance (R$_{dson}$) for the semiconductor device 300. However, other values for the range are within the scope of the present disclosure.

As shown in FIG. 5B, an example dimension of the semiconductor device 300 includes a thickness T1 of the non-raised portion 406 of the dielectric layer 314. In some implementations, the thickness T1 is included in a range of approximately 10 nanometers to approximately 700 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure.

As further shown in FIG. 5B, an example dimension of the semiconductor device 300 includes a thickness T2 of raised portion 408 of the dielectric layer 314. In some implementations, the thickness T2 is included in a range of approximately 11 nanometers to approximately 1000 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure. In some implementations, a ratio of the thickness T2 to the thickness T1 may be approximately 1.5:1 to approximately 2:1 to achieve a sufficiently low on resistance (R on) for the semiconductor device 300 while achieving a suitable electric field strength gradient in the channel region 302 between the gate structure 232 and the source/drain region 228b. However, other values for the ratio are within the scope of the present disclosure.

As further shown in FIG. 5B, an example dimension of the semiconductor device 300 includes a thickness T3 of a portion of the stepped portion 412 of the dielectric layer 314 that is included over and/or on the blocking layer 308. In some implementations, the thickness T3 is included in a range of approximately 10 nanometers to approximately 700 nanometers to achieve a sufficiently low on resistance (R$_{on}$) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure. In some implementations, T1 and T3 are approximately a same thickness.

In some implementations, a ratio of the thickness T2 to the thickness T3 may be approximately 1.5:1 to approximately 2:1 to achieve a sufficiently low on resistance (R on) for the semiconductor device 300 while achieving a suitable electric field strength gradient in the channel region 302 between the gate structure 232 and the source/drain region 228b. However, other values for the ratio are within the scope of the present disclosure.

As further shown in FIG. 5B, an example dimension of the semiconductor device 300 includes a thickness (T4) of a portion of the stepped portion 412 of the dielectric layer 314 that is adjacent to an end of the blocking layer 308 (e.g., a portion of the stepped portion 412 that is not on the blocking layer 308. In some implementations, the thickness (T4) is included in a range of approximately 20 nanometers to approximately 900 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure.

As further shown in FIG. 5B, an example dimension of the semiconductor device 300 includes a thickness (T5) of the stepped portion 414 of the dielectric layer 314. In some implementations, the thickness (T5) is included in a range of approximately 10 nanometers to approximately 700 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure. In some implementations, T1 and T5 are approximately a same thickness.

As shown in FIG. 5C, an example dimension of the semiconductor device 300 includes a thickness (T6) of the blocking layer 308. In some implementations, the thickness (T6) is included in a range of approximately 10 nanometers to approximately 200 nanometers to achieve a sufficiently low on resistance (R on) for the semiconductor device 300 while achieving a suitable electric field strength gradient in the channel region 302 between the gate structure 232 and the source/drain region 228b. The electric field strength gradient may provide an increased RESURF efficiency, which may enable a higher breakdown voltage for the semiconductor device 300 to be achieved. However, other values for the range are within the scope of the present disclosure.

As further shown in FIG. 5C, an example dimension of the semiconductor device 300 includes a thickness (T7) of the field plate layer 310. In some implementations, the thickness (T7) is included in a range of approximately 1 nanometer to approximately 100 nanometers to reduce process variation in manufacturing the semiconductor device 300 while achieving a sufficient conductivity for the field plate layer 310. However, other values for the range are within the scope of the present disclosure.

As further shown in FIG. 5C, an example dimension of the semiconductor device 300 includes a distance (D3) between the end of the field plate layer 310 and the edge of the source/drain region 228b. In some implementations, the distance (D3) is included in a range of approximately 500 nanometers to approximately 900 nanometers to achieve a sufficiently high breakdown voltage for the semiconductor device 300 while enabling increased semiconductor device density in the device 200. However, other values for the range are within the scope of the present disclosure.

As indicated above, FIGS. 5A-5C are provided as examples. Other examples may differ from what is described with regard to FIGS. 5A-5C.

Figure 6A:
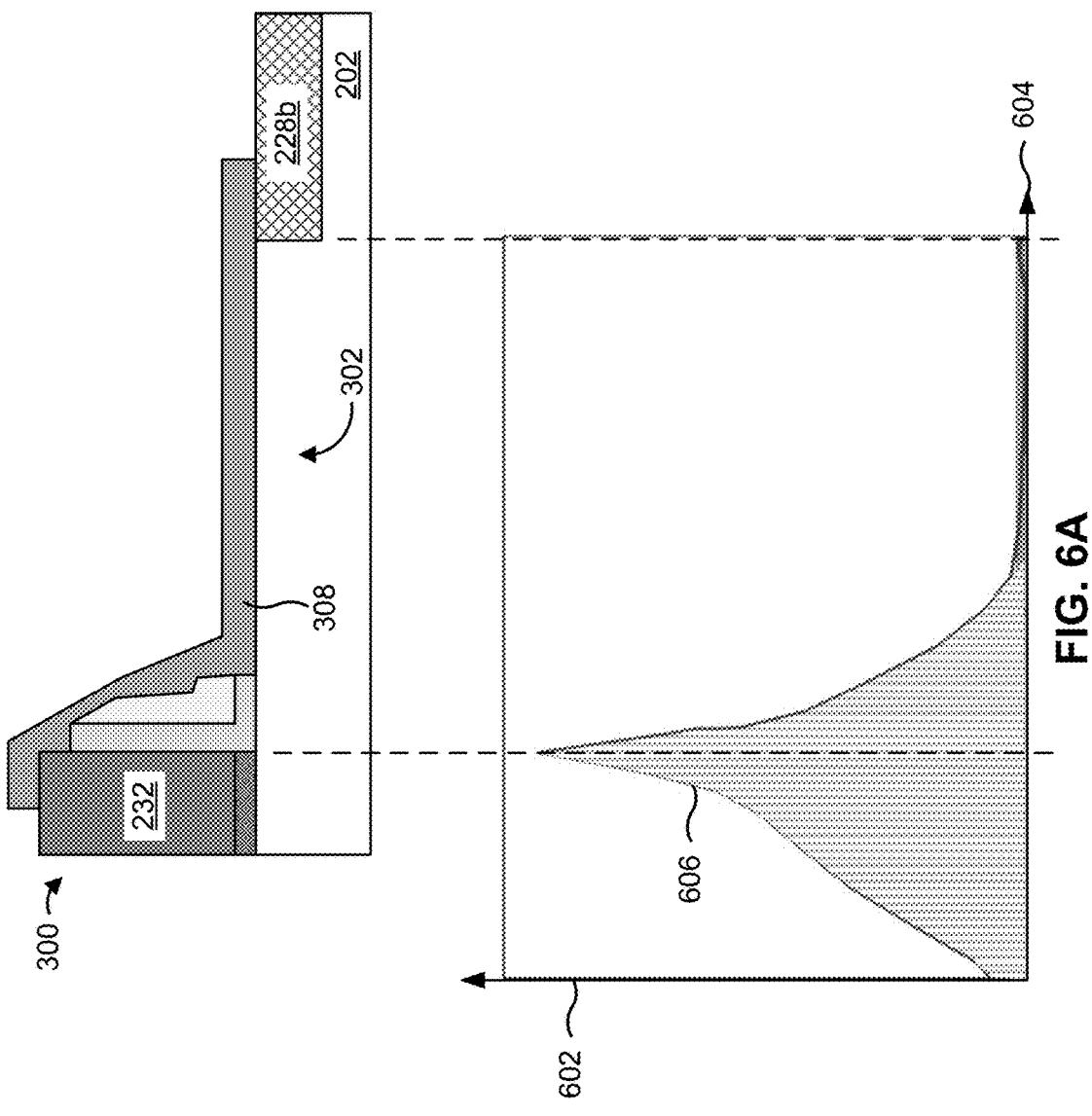
FIGS. 6A-6C are diagrams of an example implementation of electric field distributions described herein.
Figure 6B:
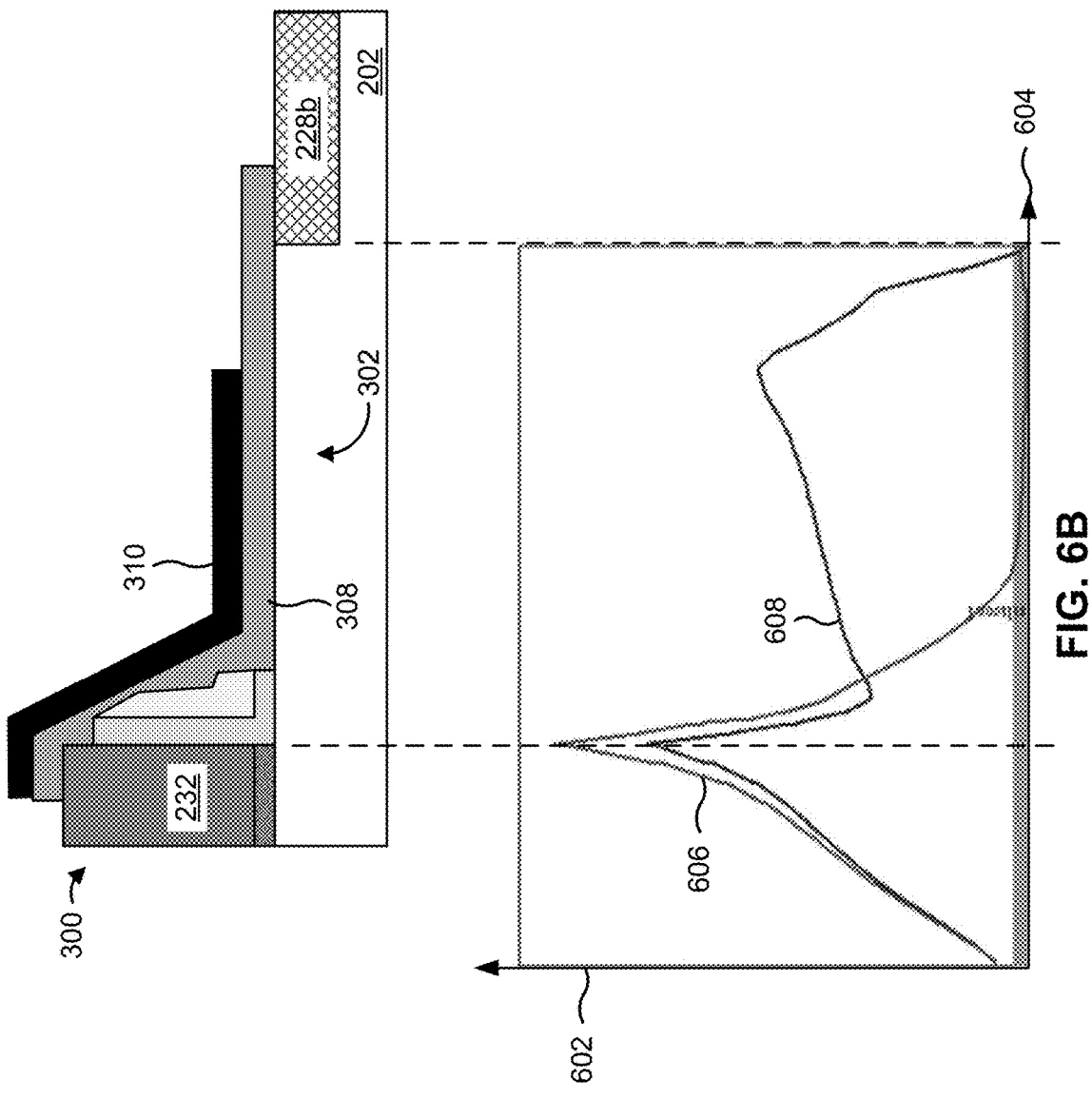
Figure 6C:
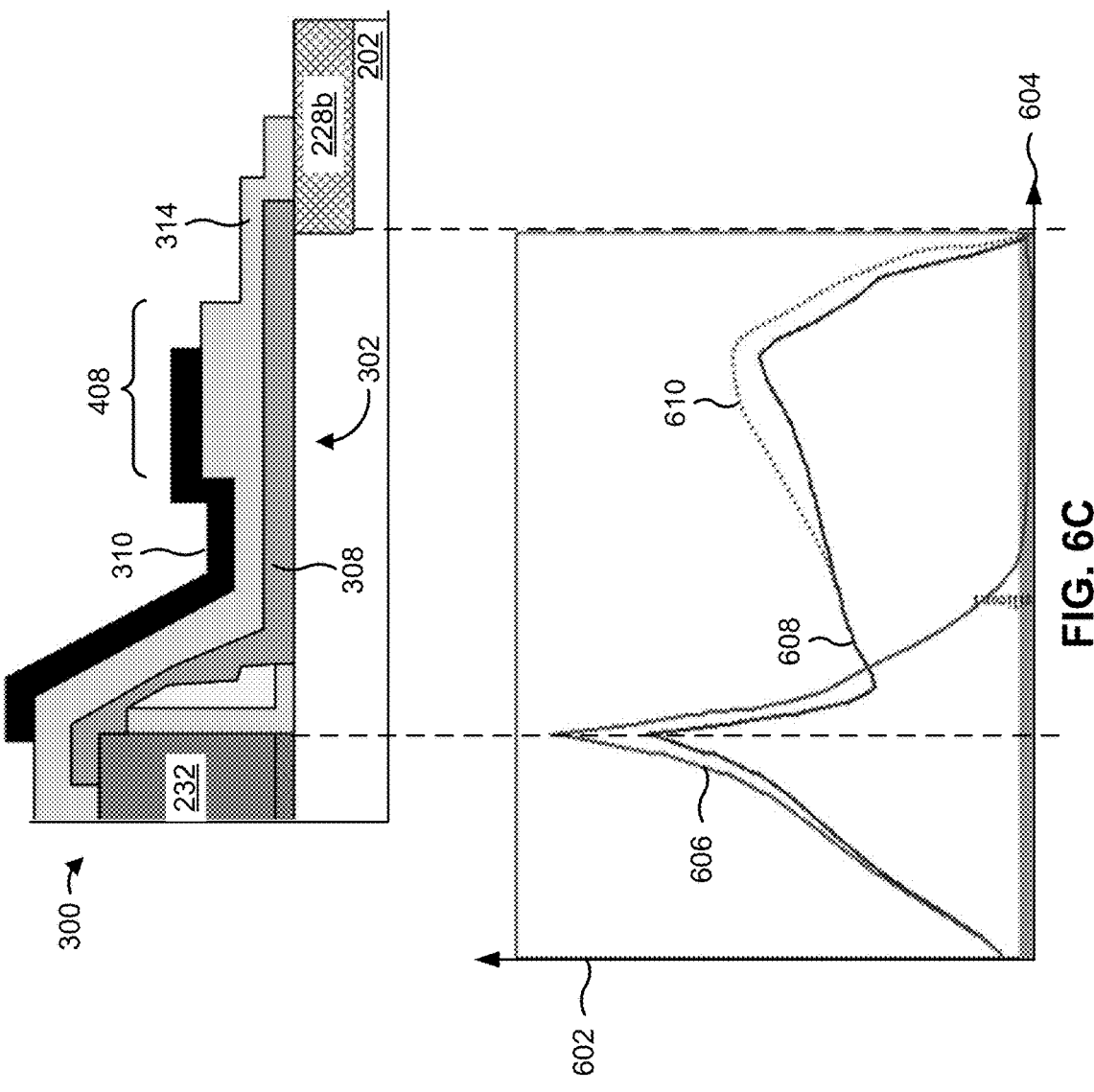

FIGS. 6A-6C are diagrams of an example implementation 600 of electric field distributions described herein.

FIG. 6A illustrates an example electric field distribution 606 in the channel region 302 of the semiconductor device 300 in an implementation in which the semiconductor device 300 does not include the field plate layer 310 and does not include the dielectric layer 314. The electric field distribution 606 is illustrated as a function of electric field strength 602 and horizontal position 604 in the channel region 302.

As shown in FIG. 6A, this implementation of the semiconductor device 300 has a relatively short/small electric field distribution 606 that is primarily focused around the gate structure 232. The breakdown voltage of the semiconductor device 300 may correspond to an integral of the electric field distribution 606. In other words, the breakdown voltage of the semiconductor device 300 may be based on the area under the curve of the electric field distribution 606. Thus, the implementation of the semiconductor device 300 illustrated in FIG. 6A provides a relatively low breakdown voltage due to the electric field distribution 606 being concentrated around the gate structure 232.

FIG. 6B illustrates an example electric field distribution 608 in the channel region 302 of the semiconductor device 300 in an implementation in which the semiconductor device 300 includes the field plate layer 310, but does not include the dielectric layer 314. As shown in FIG. 6B, the field plate layer 310 provides an increased electric field distribution 608 along the channel region 302 relative to the electric field distribution 606. The implementation of the semiconductor device 300 illustrated in FIG. 6B provides an increased breakdown voltage, relative to the implementation of the semiconductor device 300 illustrated in FIG. 6A, due to increased area under the curve of the electric field distribution 608.

FIG. 6C illustrates an example electric field distribution 610 in the channel region 302 of the semiconductor device 300 in an implementation in which the semiconductor device 300 includes the field plate layer 310 and the dielectric layer 314 having the raised portion 408 described herein. As shown in FIG. 6C, the field plate layer 310 and the raised portion 408 of the dielectric layer 314 provide a further increased electric field distribution 610 along the channel region 302 relative to the electric field distribution 606 and the electric field distribution 608. The implementation of the semiconductor device 300 illustrated in FIG. 6C provides an increased breakdown voltage, relative to the implementations of the semiconductor device 300 illustrated in FIGS. 6A and 6B, due to increased area under the curve of the electric field distribution 610.

As indicated above, FIGS. 6A-6C are provided as examples. Other examples may differ from what is described with regard to FIGS. 6A-6C.

FIGS. 7A-7L are diagrams of an example implementation 700 of forming the semiconductor device 300 described herein. In some implementations, one or more operations described in connection with FIGS. 7A-7L may be performed by one or more of the semiconductor processing tools 102-112 and/or the wafer/die transport tool 114. In some implementations, one or more operations described in connection with FIGS. 7A-7L may be performed by another semiconductor processing tool.

Figure 7A:
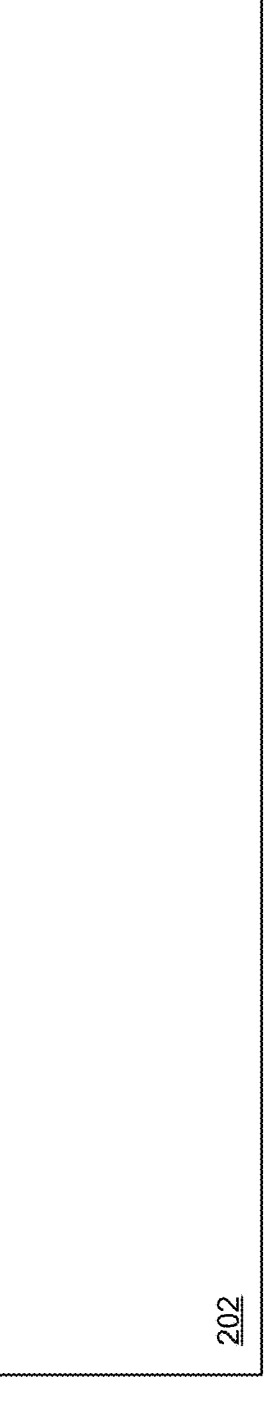
FIGS. 7A-7L are diagrams of an example implementation of forming a semiconductor device described herein.

Turning to FIG. 7A, one or more of the operations in the example implementation 600 may be performed in connection with the substrate 202 of the semiconductor device 300, which may be included in the device 200. The substrate 202 may be provided in the form of a semiconductor wafer or another type of substrate.

Figure 7B:
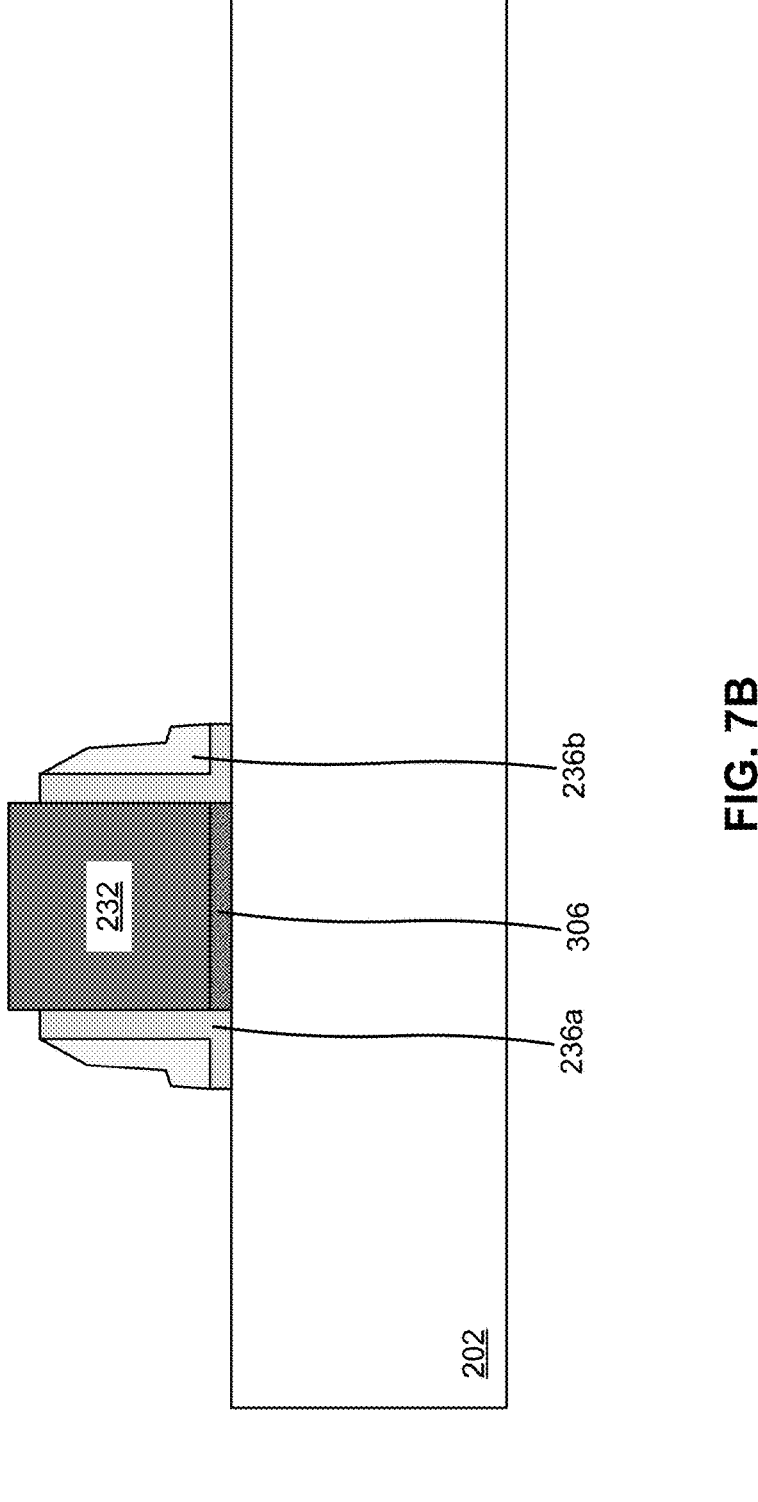

As shown in FIG. 7B, the gate dielectric layer 306 may be formed on the substrate 202. As an example, the gate dielectric layer 306 may be formed (e.g., by the deposition tool 102) by chemical oxidation, thermal oxidation, ALD, CVD, and/or other suitable methods. The gate structure 232 may be formed over and/or on the gate dielectric layer 306. The deposition tool 102 and/or the plating tool 112 may deposit the gate structure 232 using a CVD technique, an ALD technique, a PVD technique, an electroplating technique, and/or another type of deposition technique.

In some implementations, a dummy gate structure is formed in place of the gate structure 232. In these implementations, the dummy gate structure may be removed after formation of source/drain regions of the semiconductor device 300. This may be referred to as a gate replacement process. The gate structure 232 may be formed in the space left behind after removal of the dummy gate structure.

The sidewall spacer layers (e.g., the seal spacer layers 236a, the bulk spacer layers 236b) may be deposited (e.g., by the deposition tool 102) using a CVD technique, an ALD technique, a PVD technique, and/or another type of deposition technique. In some implementations, the sidewall spacer layers 236 (e.g., the seal spacer layers 236a, the bulk spacer layers 236b) are deposited on the sidewalls of the gate structure 232. In implementations in which a dummy gate structure is formed as a placeholder for the gate structure 232, the sidewall spacer layers 236 (e.g., the seal spacer layers 236a, the bulk spacer layers 236b) may be formed on the sidewalls of the dummy gate structure. After removal of the dummy gate structure, the gate structure 232 may be deposited in the space between the sidewall spacer layers 236 (e.g., the seal spacer layers 236a, the bulk spacer layers 236b) that was occupied by the dummy gate structure.

Figure 7C:
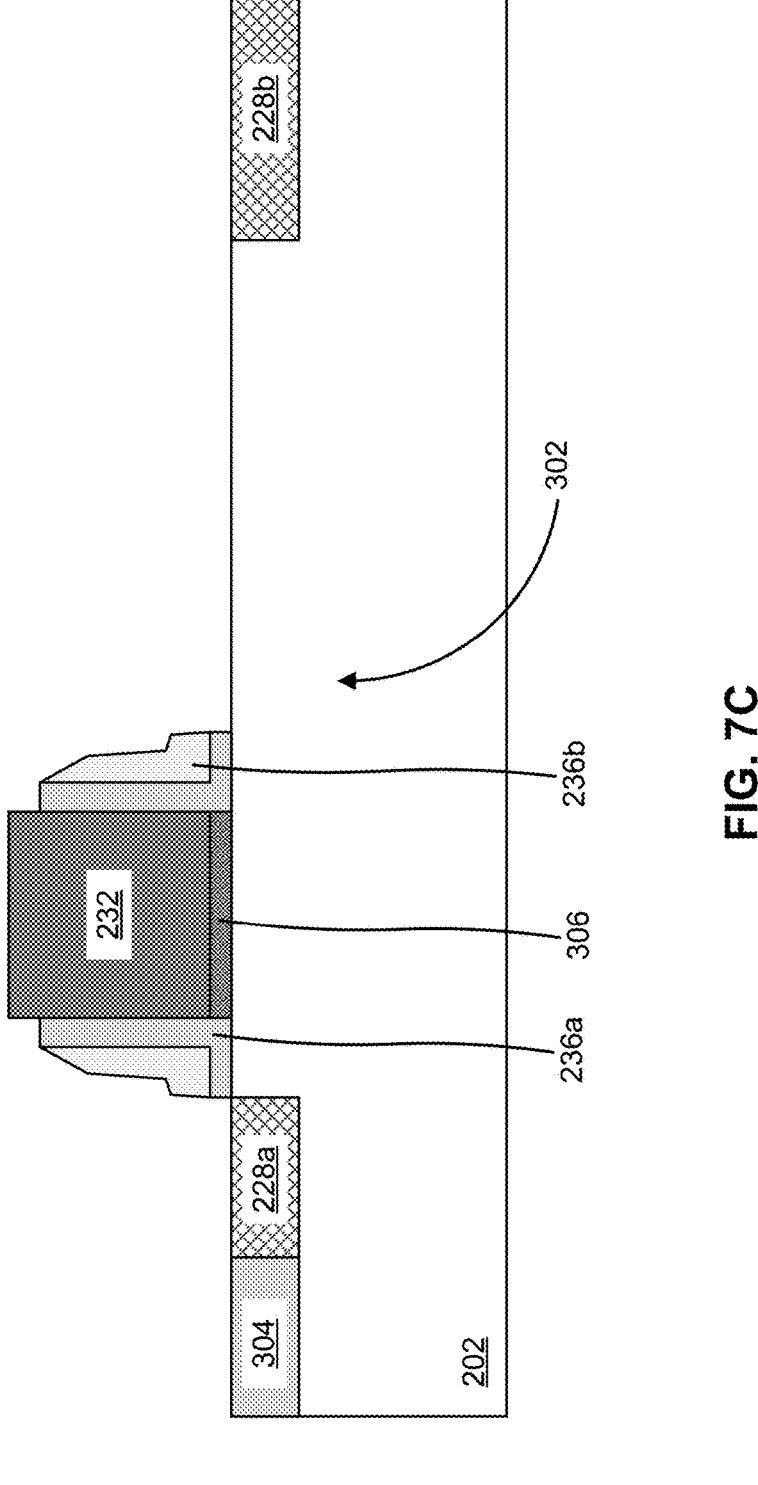

As shown in FIG. 7C, one or more isolation regions 304 may be formed in the substrate 202. Forming the one or more isolation regions 304 may include etching (e.g., by the etch tool 108) the substrate 202 to form one or more recesses in the substrate 202. The deposition tool 102 may then deposit the one or more isolation regions 304 in the one or more recesses using a CVD technique, an ALD technique, a PVD technique, and/or another type of deposition technique. In some implementations, the planarization tool 110 may perform a CMP operation to planarize the one or more isolation regions 304 after the one or more isolation regions 304 are deposited.

As further shown in FIG. 7C, a source/drain region 228a may be formed on a first side of the gate structure 232, and a source/drain region 228b may be formed on a second side of the gate structure 232 opposing the first side. Accordingly, the gate structure 232 is between the source/drain region 228a and the source/drain region 228b. This enables the gate structure 232 to selectively control the electrical conductivity of a channel region 302 in the substrate 202 between the source/drain region 228a and the source/drain region 228b.

To form the source/drain region 228a and the source/drain region 228b, the etch tool 108 may etch the substrate 202 to form recesses in the substrate 202. The etch operation may be referred to a strained source/drain (SSD) etch operation, and the recesses may be referred to as strained source/drain recesses. In some implementations, the etch operation includes a plasma etch technique, a wet chemical etch technique, and/or another type of etch technique.

The deposition tool 102 may deposit the source/drain region 228a and the source/drain region 228b in the recesses. The deposition tool 102 forms the source/drain region 228a and the source/drain region 228b by an epitaxial operation, in which layers of the epitaxial material are deposited in the recesses such that the layers of p-type source/drain regions and/or layers of n-type source/drain regions are formed by epitaxial growth in a particular crystalline orientation.

The material (e.g., silicon (Si), gallium (Ga), or another type of semiconductor material) that is used to form the source/drain region 228a and the source/drain region 228b may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

Figure 7D:
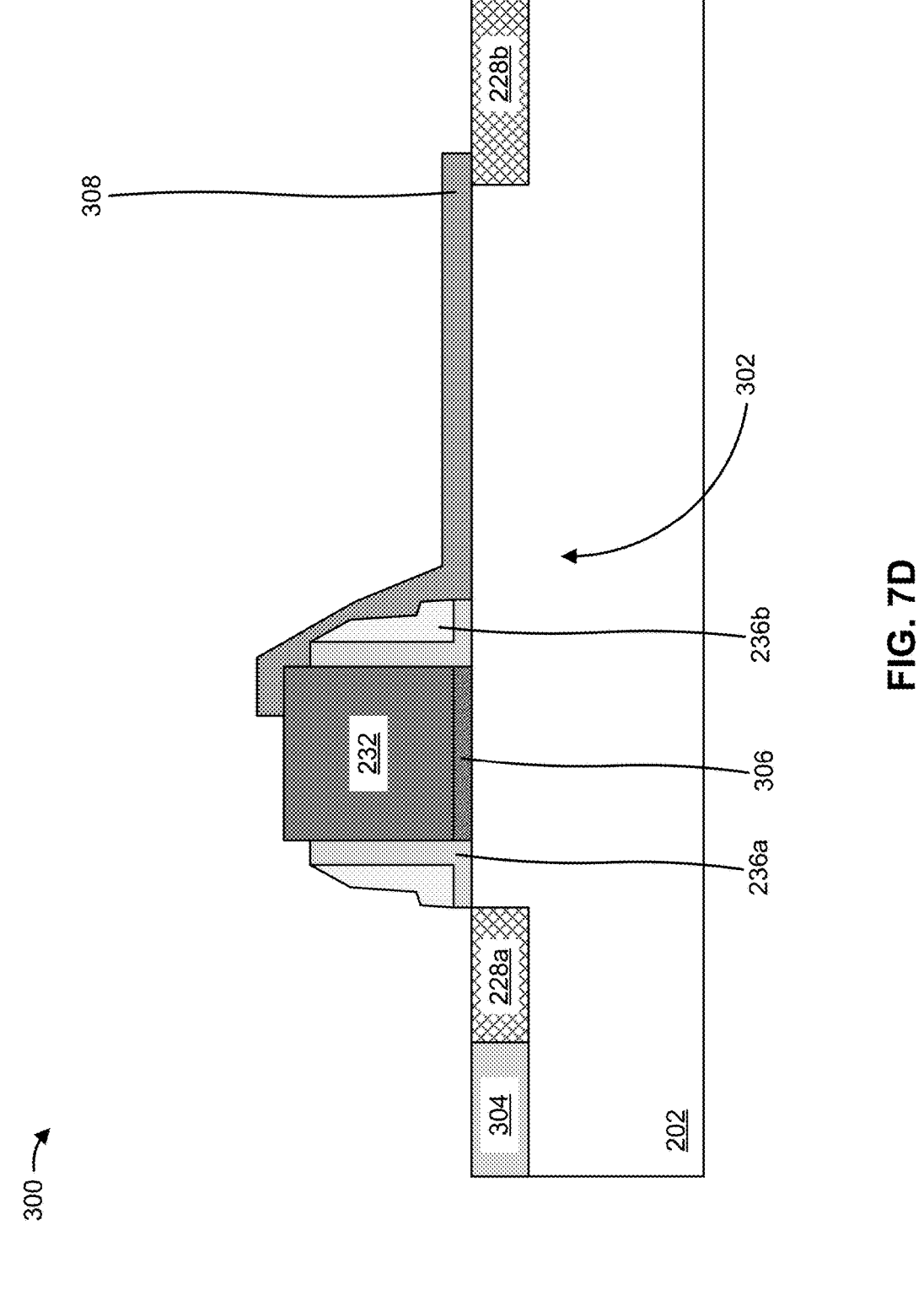

As shown in FIG. 7D, a blocking layer 308 may be formed over and/or on the substrate 202 between the gate structure 232 and the source/drain region 228b. The blocking layer 308 may include an angled portion that extends along a sidewall of the gate structure 232. moreover, the blocking layer 308 may include a portion that extends over a portion of the source/drain region 228b.

The deposition tool 102 may deposit the blocking layer 308 using a CVD technique, an ALD technique, a PVD technique, and/or another type of deposition technique. In some implementations, the deposition tool 102 deposits the blocking layer 308 as a blanket layer the covers the semiconductor device 300. The etch tool 108 may subsequently remove portions of the blocking layer 308 over the source/drain region 228a and the source/drain region 228b such that the source/drain region 228a and the source/drain region 228b are exposed through the blocking layer 308. This enables metal silicide layers to be formed over the source/drain region 228a and the source/drain region 228b.

Figure 7E:
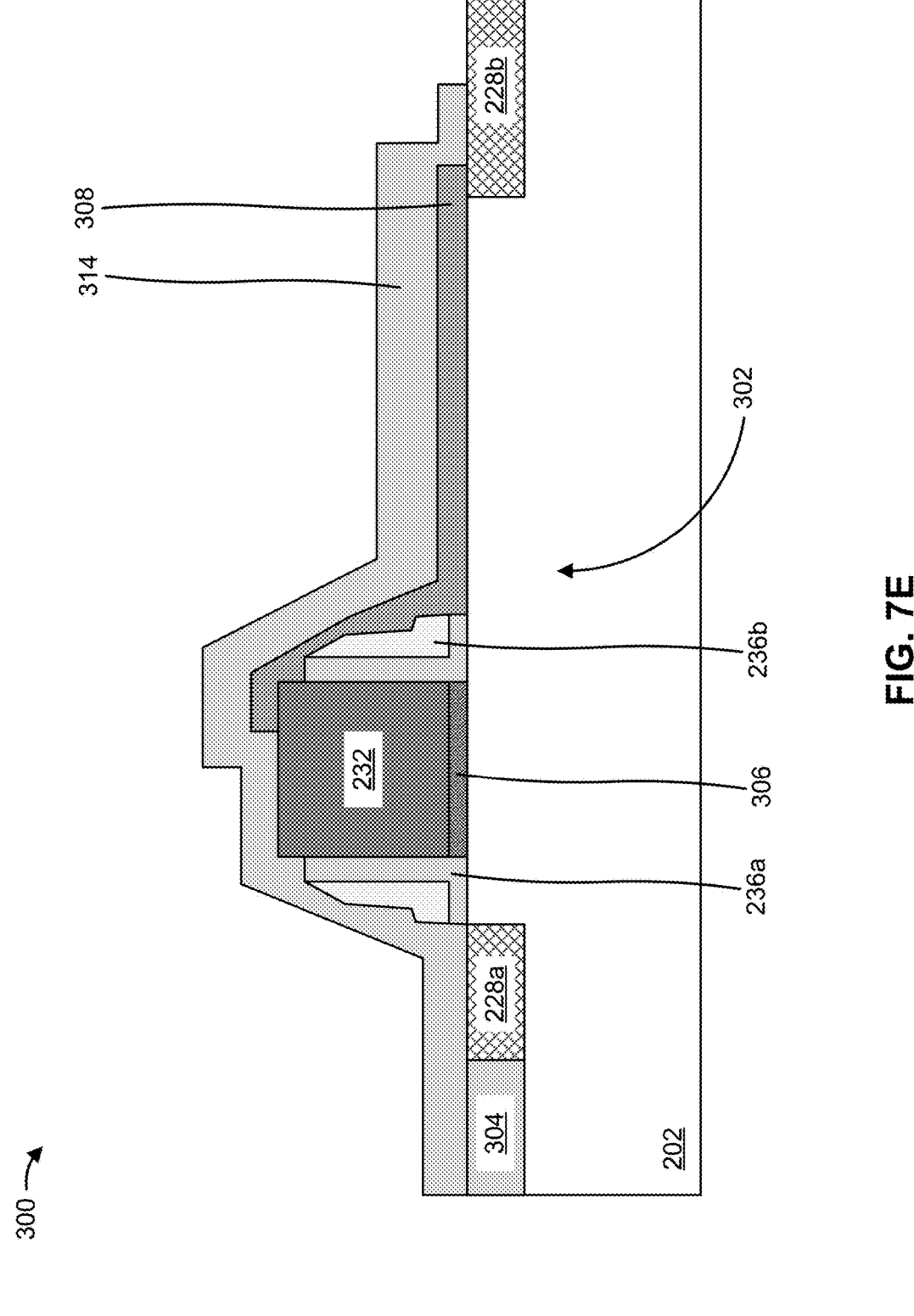

As shown in FIG. 7E, a dielectric layer 314 may be formed over the substrate 202. In particular, the deposition tool 102 deposits the dielectric layer 314 as a blanket layer the covers the semiconductor device 300. The deposition tool 102 may deposit the dielectric layer 314 using a CVD technique, an ALD technique, a PVD technique, and/or another type of deposition technique. Thus, the deposition tool 102 may form the dielectric layer 314 over and/or on the one or more isolation regions 304, over and/or on the source/drain region 228a, over and/or on the gate structure 232, over and/or on the sidewall spacer layers 236 (e.g., the seal spacer layers 236a, the bulk spacer layers 236b), over and/or on the blocking layer 308, and/or over and/or on the source/drain region 228b, among other examples.

Figure 7F:
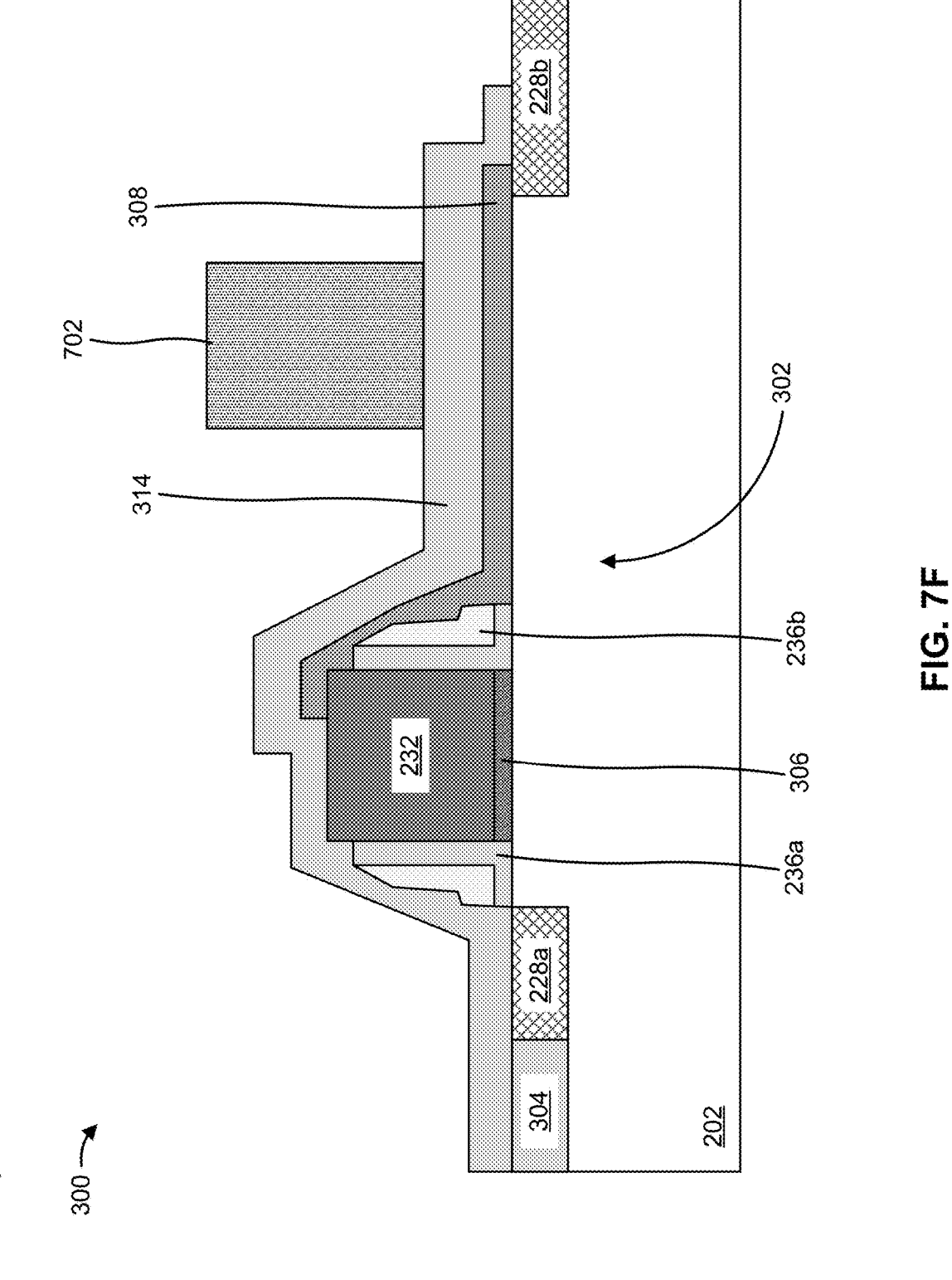

As shown in FIG. 7F, masking layer 702 may be formed over and/or on a portion of the dielectric layer. In some implementations, a pattern in a photoresist layer is used as the masking layer 702. In these implementations, the deposition tool 102 forms the photoresist layer over the semiconductor device 300. The exposure tool 104 exposes the photoresist layer to a radiation source to pattern the photoresist layer. The developer tool 106 develops and removes portions of the photoresist layer to expose the pattern to form the masking layer 702. Alternatively, a hard mask layer may be used as the masking layer 702. In these implementations, the pattern in the photoresist layer may be used to etch the hard mask layer to form the masking layer 702.

Figure 7G:
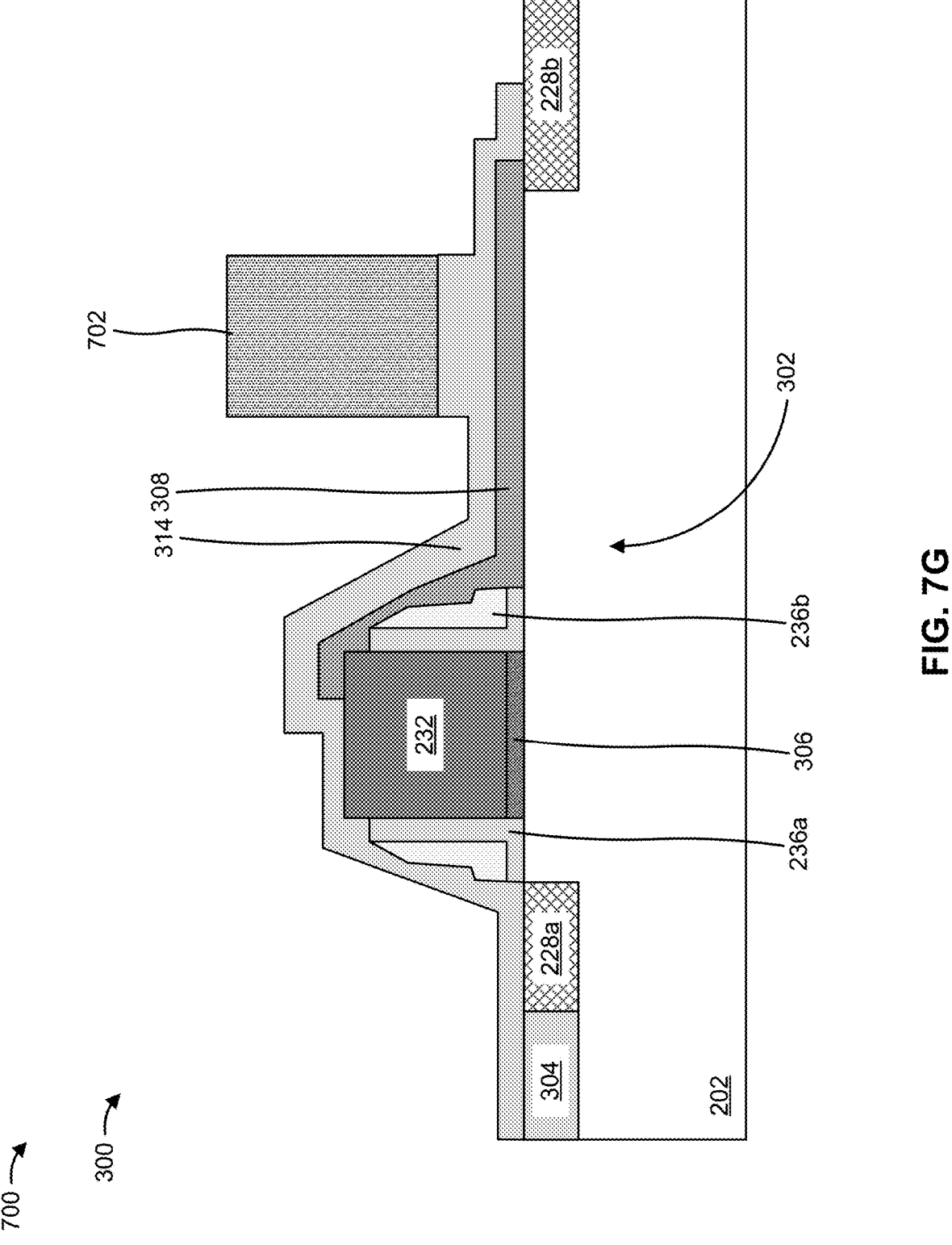

As shown in FIG. 7G, the dielectric layer 314 may be etched based on the masking layer 702 in an etch operation. The etch tool 108 etches the dielectric layer 314 based on the masking layer 702 using a plasma etch technique, a wet chemical etch technique, and/or another type of etch technique. The etch operation may reduce the thickness of the portions of the dielectric layer 314 that are not covered or protected by the masking layer 702. The masking layer 702 protects a portion of the dielectric layer 314 that corresponds to the raised portion 408. This results in formation of the non-raised portion 406 and the stepped portions 412 and 414 in the stair stepped portion 410.

Figure 7H:
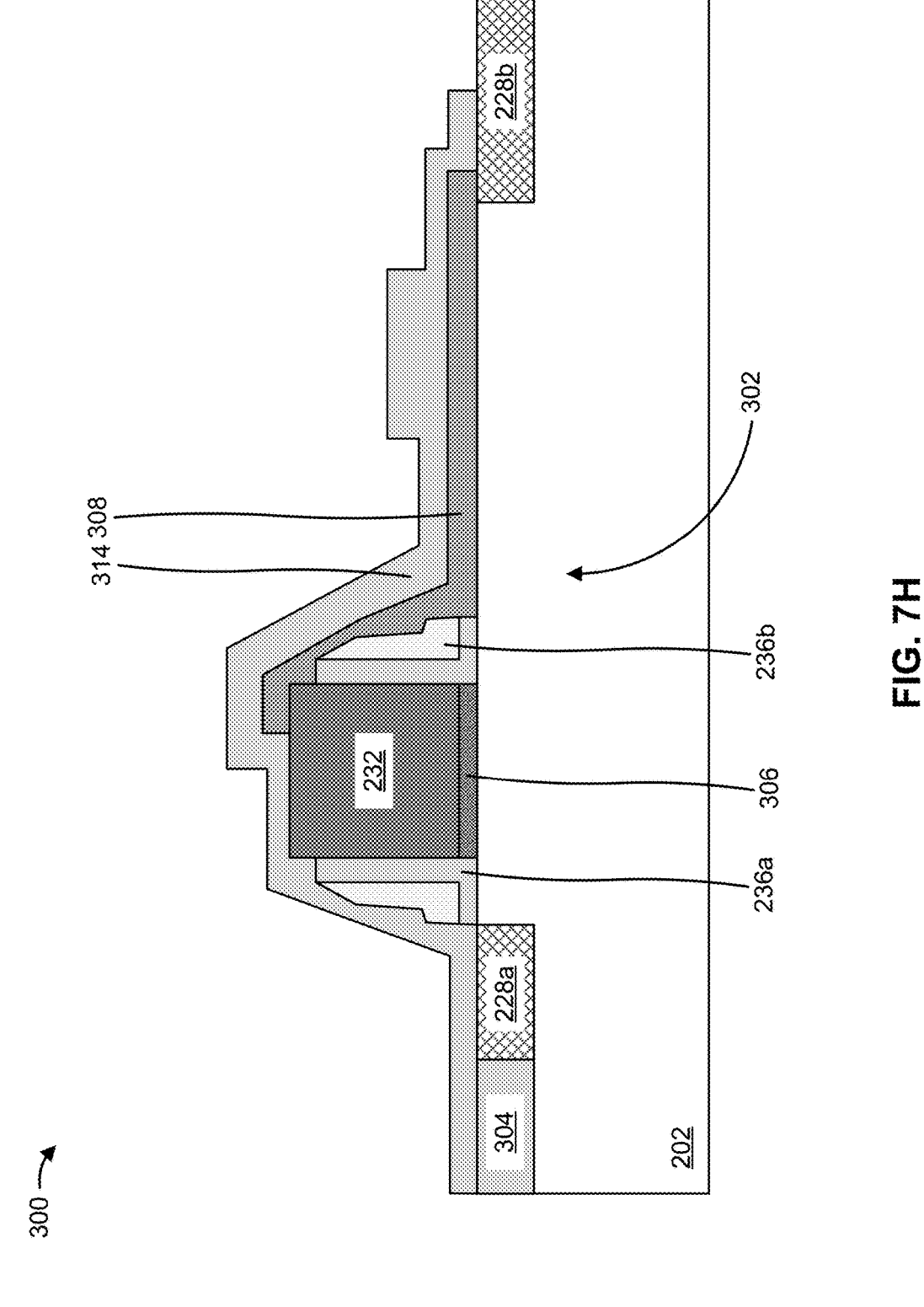

As shown in FIG. 7H, the masking layer 702 may be removed after the etch tool 108 etches the dielectric layer 314 based on the masking layer 702. In some implementations, a photoresist removal tool removes the remaining portions of the masking layer 702 using a chemical stripper, plasma ashing, and/or another technique. A second etch may be performed without the masking layer 702 after the masking layer 702 is removed.

Figure 7I:
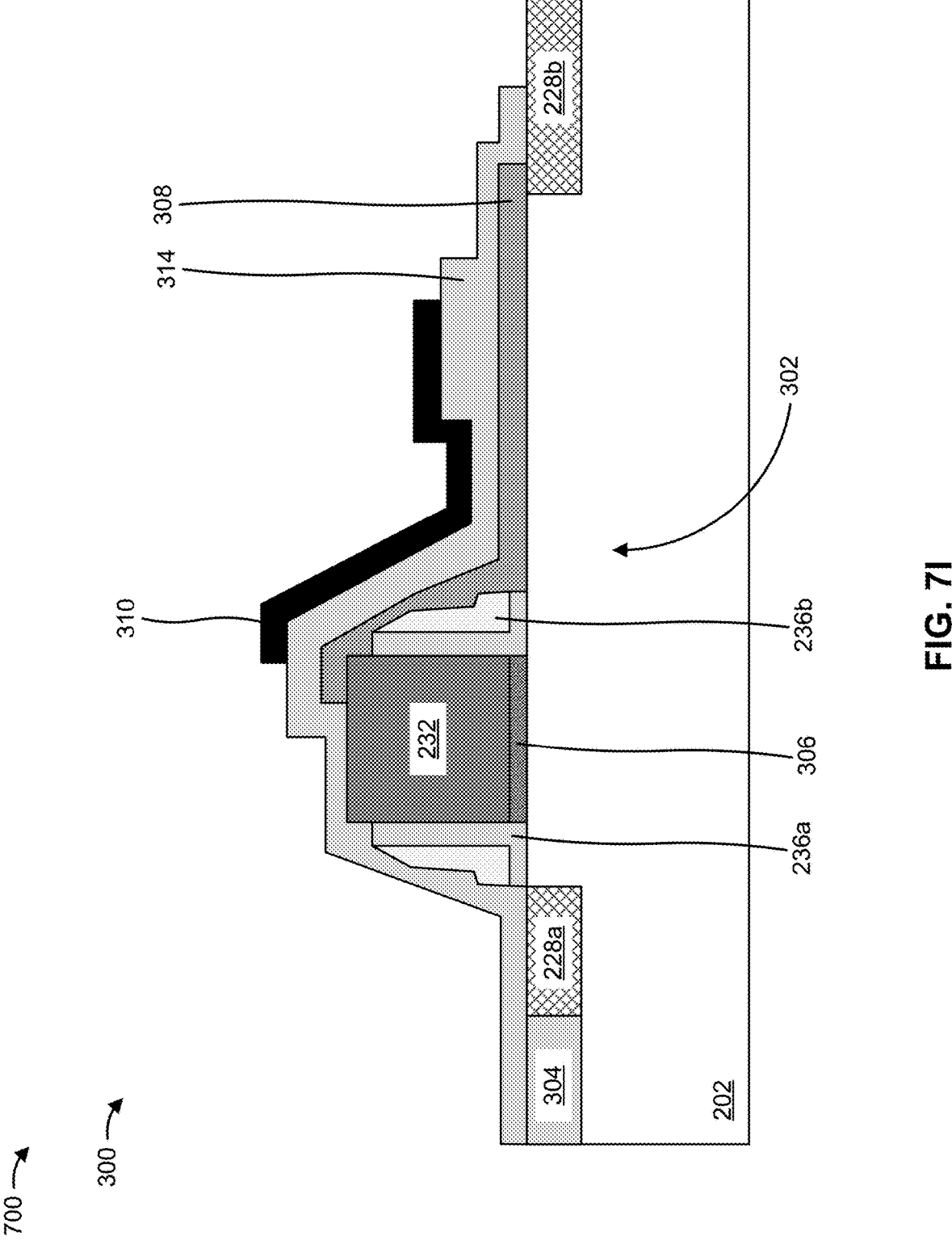

As shown in FIG. 7I, a field plate layer 310 may be formed over and/or on the dielectric layer 314 after the dielectric layer 314 is etched to form the raised portion 410, and after the masking layer 702 is removed. The deposition tool 102 and/or the plating tool 112 may deposit the field plate layer 310 using a CVD technique, an ALD technique, a PVD technique, an electroplating technique, and/or another type of deposition technique. In some implementations, the deposition tool 102 deposits the field plate layer 310 as a blanket layer the covers the semiconductor device 300. The etch tool 108 may subsequently remove portions of the field plate layer 310 such that the remaining portion of the field plate layer 310 is over the flat portion 402, over the angled portion 404, over the non-raised portion 406, and over a portion of the raised portion 408 of the dielectric layer 314.

Figure 7J:
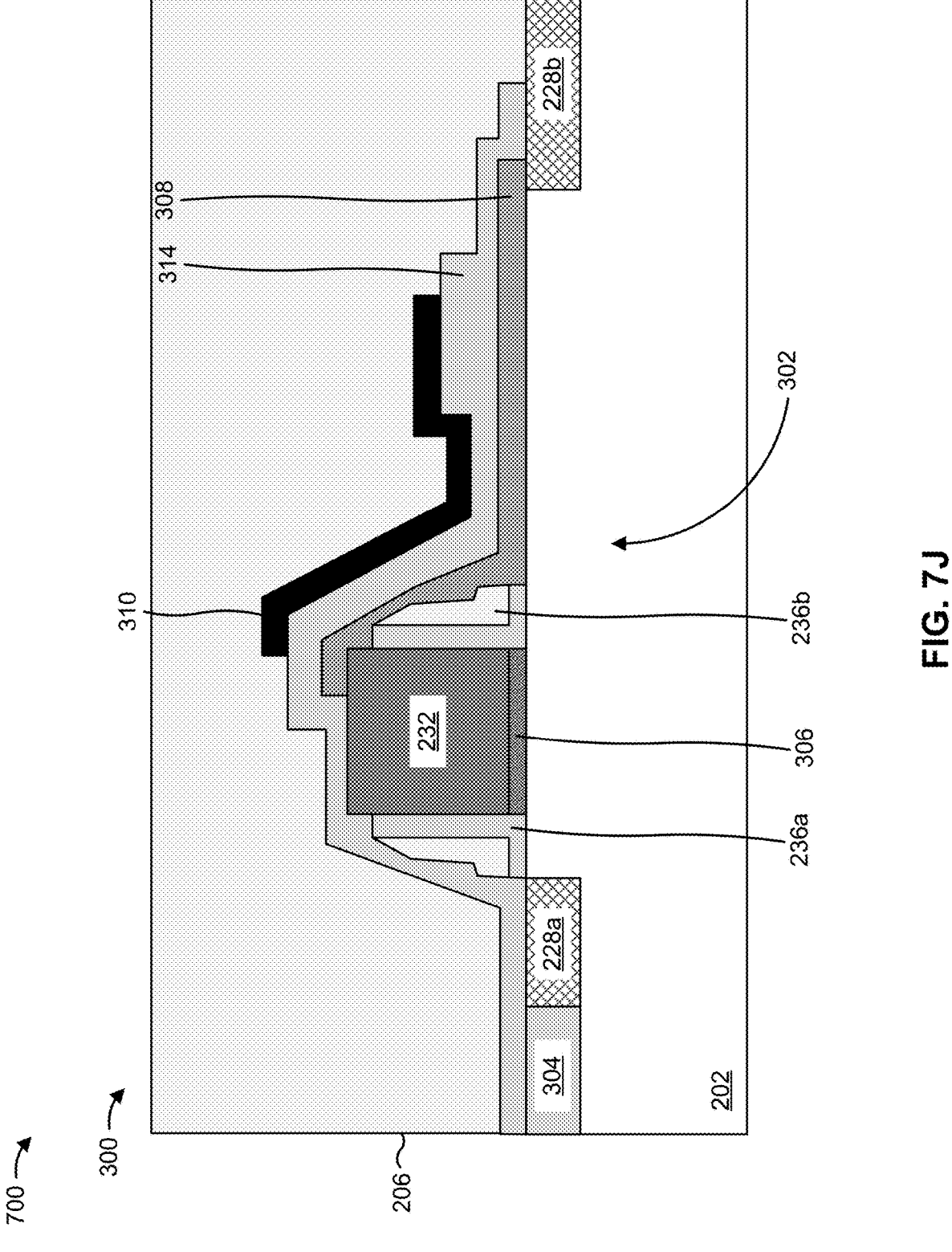

As shown in FIG. 7J, a plurality of dielectric layers may be formed over and/or on the semiconductor device 300. For example, a dielectric layer 206 may be formed over and/or on the semiconductor device 300. As another example, an ESL may be formed over and/or on the dielectric layer 206, and/or a dielectric layer may be formed over and/or on the ESL. The deposition tool 102 may deposit the dielectric layer 206, the ESL, and/or the dielectric layer using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 206, the ESL, and/or the dielectric layer.

Figure 7K:
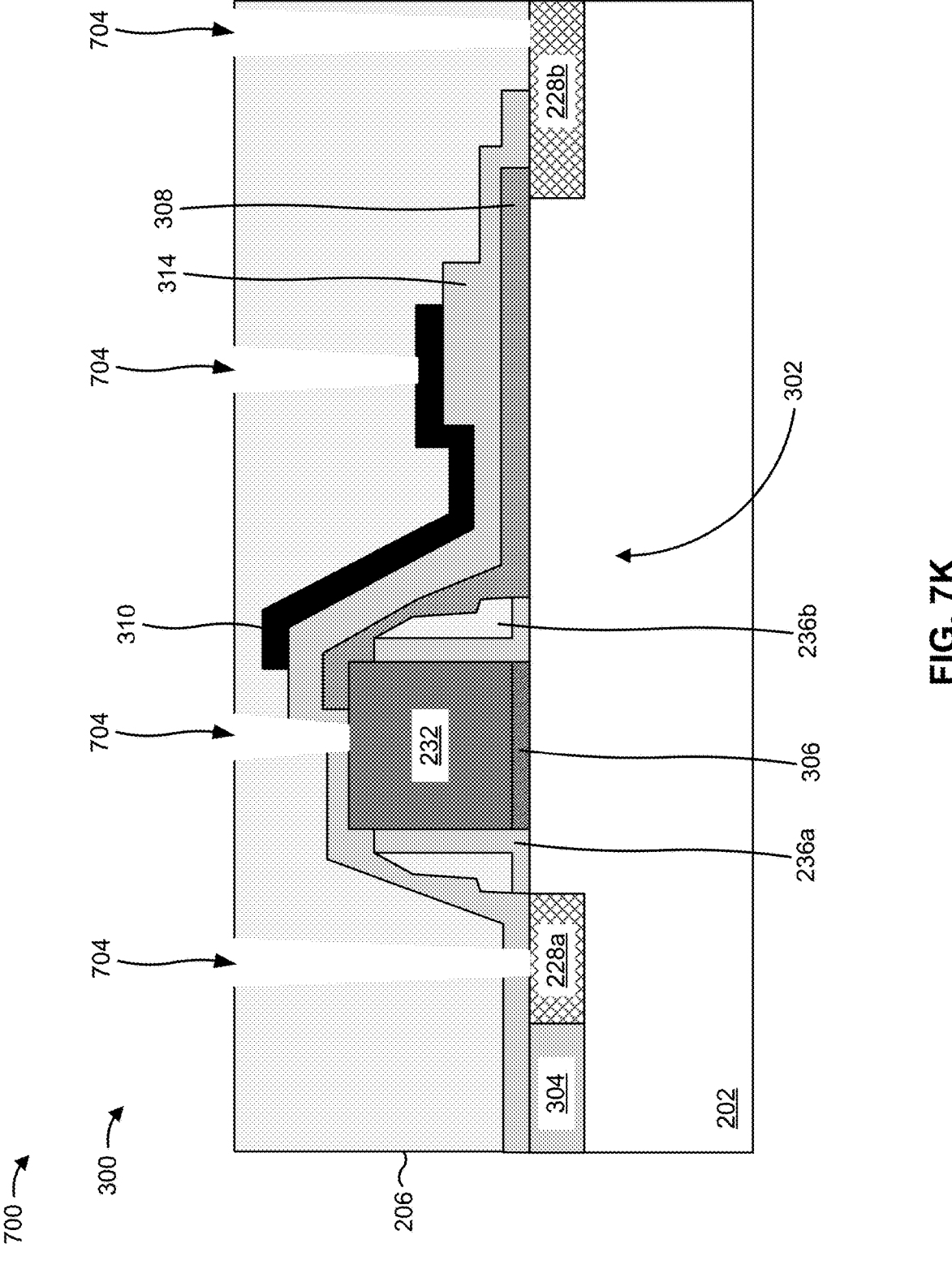

As shown in FIG. 7K, recesses 704 may be formed through the dielectric layer 206 and/or through the dielectric layer 314. For example, a recess 704 may be formed over the source/drain region 228a to expose the source/drain region 228a through the recess 704. As another example, a recess 704 may be formed over the source/drain region 228b to expose the source/drain region 228b through the recess 704. As another example, a recess 704 may be formed over the gate structure 232 to expose the gate structure 232 through the recess 704. As another example, a recess 704 may be formed over the field plate layer 310 to expose the field plate layer 310 through the recess 704. The deposition tool 102 and/or the plating tool 112 may deposit the source/drain contacts 230, the gate contact 242, and/or the field plate contact 312 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the source/drain contacts 230, the gate contact 242, and/or the field plate contact 312 after the source/drain contacts 230, the gate contact 242, and/or the field plate contact 312 are formed.

In some implementations, a pattern in a photoresist layer is used to form the recesses 704. In these implementations, the deposition tool 102 forms the photoresist layer over the dielectric layer 206. The exposure tool 104 exposes the photoresist layer to a radiation source to pattern the photoresist layer. The developer tool 106 develops and removes portions of the photoresist layer to expose the pattern. The etch tool 108 etches through the dielectric layer 206 and/or through the dielectric layer 314 to form the recesses 704. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 704 based on a pattern.

Figure 7L:
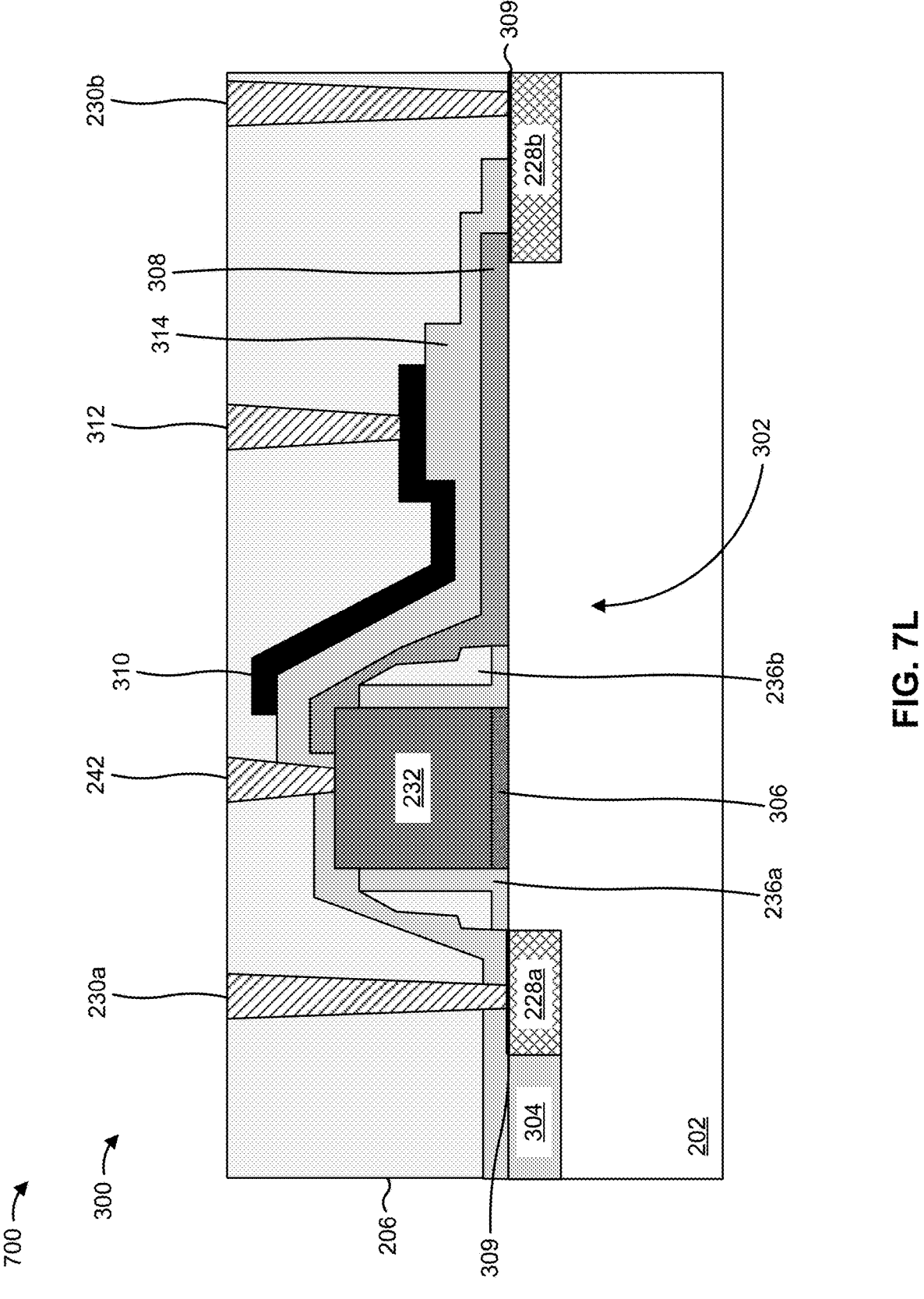

As shown in FIG. 7L, a source/drain contact 230a may be formed in the recess 704 over the source/drain region 228a. A source/drain contact 230b may be formed in the recess 704 over the source/drain region 228b. A gate contact 242 may be formed in the recess 704 over the gate structure 232. The field plate contact 312 may be formed in the recess 704 over the field plate layer 310. The field plate contact 312 may be landed on the rise portion of the field plate layer 310.

In some implementations, one or more additional layers are formed in the recesses 704 prior to formation of the source/drain contact 230a over the source/drain region 228a and/or prior to formation of the source/drain contact 230b over the source/drain region 228b. As an example, a metal silicide layer 309 (e.g., titanium nitride (TiSi$_x$) or another metal silicide layer) may be formed on the top surfaces of the source/drain region 228a and/or the source/drain region 228b prior to formation of the source/drain contact 230a and/or prior to formation of the source/drain contact 230b. As another example, one or more barrier layers may be formed on the bottom surfaces and/or on the sidewalls in the recesses 704 prior to formation of the source/drain contact 230a and/or prior to formation of the source/drain contact 230b. As another example, one or more adhesion layers may be formed on the bottom surfaces and/or on the sidewalls in the recesses 704 prior to formation of the source/drain contact 230a and/or prior to formation of the source/drain contact 230b.

As indicated above, FIGS. 7A-7L are provided an example. Other examples may differ from what is described with regard to FIGS. 7A-7L.

Figure 8:
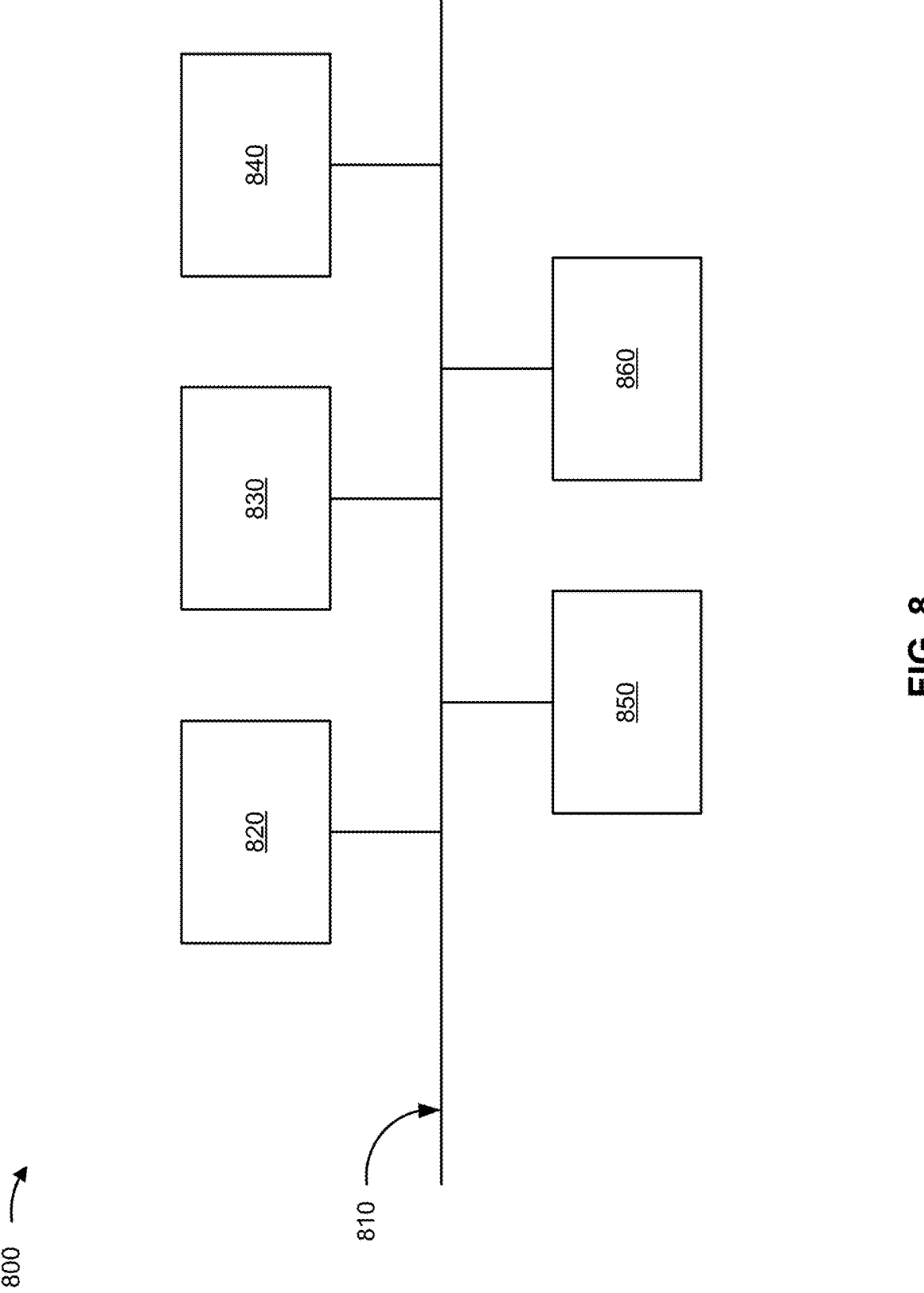
FIG. 8 is a diagram of example components of a device described herein.

FIG. 8 is a diagram of example components of a device 800 described herein. In some implementations, one or more of the semiconductor processing tools 102-112 and/or the wafer/die transport tool 114 may include one or more devices 800 and/or one or more components of the device 800. As shown in FIG. 8, the device 800 may include a bus 810, a processor 820, a memory 830, an input component 840, an output component 850, and/or a communication component 860.

The bus 810 may include one or more components that enable wired and/or wireless communication among the components of the device 800. The bus 810 may couple together two or more components of FIG. 8, such as via operative coupling, communicative coupling, electronic coupling, and/or electric coupling. For example, the bus 810 may include an electrical connection (e.g., a wire, a trace, and/or a lead) and/or a wireless bus. The processor 820 may include a central processing unit, a graphics processing unit, a microprocessor, a controller, a microcontroller, a digital signal processor, a field-programmable gate array, an application-specific integrated circuit, and/or another type of processing component. The processor 820 may be implemented in hardware, firmware, or a combination of hardware and software. In some implementations, the processor 820 may include one or more processors capable of being programmed to perform one or more operations or processes described elsewhere herein.

The memory 830 may include volatile and/or nonvolatile memory. For example, the memory 830 may include random access memory (RAM), read only memory (ROM), a hard disk drive, and/or another type of memory (e.g., a flash memory, a magnetic memory, and/or an optical memory). The memory 830 may include internal memory (e.g., RAM, ROM, or a hard disk drive) and/or removable memory (e.g., removable via a universal serial bus connection). The memory 830 may be a non-transitory computer-readable medium. The memory 830 may store information, one or more instructions, and/or software (e.g., one or more software applications) related to the operation of the device 800. In some implementations, the memory 830 may include one or more memories that are coupled (e.g., communicatively coupled) to one or more processors (e.g., processor 820), such as via the bus 810. Communicative coupling between a processor 820 and a memory 830 may enable the processor 820 to read and/or process information stored in the memory 830 and/or to store information in the memory 830.

The input component 840 may enable the device 800 to receive input, such as user input and/or sensed input. For example, the input component 840 may include a touch screen, a keyboard, a keypad, a mouse, a button, a microphone, a switch, a sensor, a global positioning system sensor, an accelerometer, a gyroscope, and/or an actuator. The output component 850 may enable the device 800 to provide output, such as via a display, a speaker, and/or a light-emitting diode. The communication component 860 may enable the device 800 to communicate with other devices via a wired connection and/or a wireless connection. For example, the communication component 860 may include a receiver, a transmitter, a transceiver, a modem, a network interface card, and/or an antenna.

The device 800 may perform one or more operations or processes described herein. For example, a non-transitory computer-readable medium (e.g., memory 830) may store a set of instructions (e.g., one or more instructions or code) for execution by the processor 820. The processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, the processor 820 may be configured to perform one or more operations or processes described herein. Thus, implementations described herein are not limited to any specific combination of hardware circuitry and software.

The number and arrangement of components shown in FIG. 8 are provided as an example. The device 800 may include additional components, fewer components, different components, or differently arranged components than those shown in FIG. 8. Additionally, or alternatively, a set of components (e.g., one or more components) of the device 800 may perform one or more functions described as being performed by another set of components of the device 800.

FIG. 9 is a flowchart of an example process 900 associated with forming a semiconductor device described herein. In some implementations, one or more process blocks of FIG. 9 are performed by one or more semiconductor processing tools (e.g., one or more of the semiconductor processing tools 102-112). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a gate structure over a substrate of a semiconductor device (block 910). For example, one or more of the semiconductor processing tools 102-112 may form a gate structure 232 over a substrate 202 of a semiconductor device 300, as described herein.

As further shown in FIG. 9, process 900 may include forming a first source/drain region in the substrate (block 920). For example, one or more of the semiconductor processing tools 102-112 may form a first source/drain region 228a in the substrate 202, as described herein. In some implementations, the first source/drain region 228a is on a first side of the gate structure 232.

As further shown in FIG. 9, process 900 may include forming a second source/drain region in the substrate (block 930). For example, one or more of the semiconductor processing tools 102-112 may form a second source/drain region 228b in the substrate 202, as described herein. In some implementations, the second source/drain region 228b is on a second side of the gate structure 232 opposing the first side.

As further shown in FIG. 9, process 900 may include forming a dielectric layer over the substrate between the gate structure and the second source/drain region (block 940). For example, one or more of the semiconductor processing tools 102-112 may form a dielectric layer 314 over the substrate 202 between the gate structure 232 and the second source/drain region 228b, as described herein.

As further shown in FIG. 9, process 900 may include forming a masking layer over a portion of the dielectric layer (block 950). For example, the one or more of the semiconductor processing tools 102-112 may form a masking layer 702 over a portion of the dielectric layer 314, as described herein.

As further shown in FIG. 9, process 900 may include etching the dielectric layer based on the masking layer (block 960). For example, one or more of the semiconductor processing tools 102-112 may etch the dielectric layer 314 based on the masking layer 702, as described herein. In some implementations, the masking layer 702 protects the portion of the dielectric layer 314 from being etched. In some implementations, etching the dielectric layer 314 based on the masking layer 702 results in the portion of the dielectric layer 314 being a raised portion 408 that is located between non-raised portions (e.g., a non-raised portion 406 and a stair stepped portion 410) of the dielectric layer 314.

As further shown in FIG. 9, process 900 may include removing the masking layer after etching the dielectric layer based on the masking layer (block 970). For example, one or more of the semiconductor processing tools 102-112 may remove the masking layer 702 after etching the dielectric layer 314 based on the masking layer, as described herein.

As further shown in FIG. 9, process 900 may include forming a field plate layer that extends along the dielectric layer after removing the masking layer (block 980). For example, one or more of the semiconductor processing tools 102-112 may form a field plate layer 310 that extends along the dielectric layer 314 after removing the masking layer 702, as described herein.

Process 900 may include additional implementations, such as any single implementation or any combination of implementations described below and/or in connection with one or more other processes described elsewhere herein.

In a first implementation, process 900 includes forming a blocking layer 308 on the substrate 202 between the gate structure 232 and the second source/drain region 228b, where forming the dielectric layer 314 includes forming the dielectric layer 314 on the blocking layer 308.

In a second implementation, alone or in combination with the first implementation, forming the dielectric layer 314 includes forming a stair stepped portion 410 of the dielectric layer 314 on the substrate 202 adjacent to an end of the blocking layer 308.

In a third implementation, alone or in combination with one or more of the first and second implementations, forming the dielectric layer 314 includes forming a stair stepped portion 410 of the dielectric layer 314 on the second source/drain region 228b adjacent to an end of the blocking layer 308.

In a fourth implementation, alone or in combination with one or more of the first through third implementations, forming the dielectric layer 314 includes forming the dielectric layer 314 such that a thickness (T2) of the raised portion 408 is included in a range of approximately 10 nanometers to approximately 1000 nanometers.

In a fifth implementation, alone or in combination with one or more of the first through fourth implementations, etching the dielectric layer 314 includes etching the dielectric layer 314 such that a thickness (T1, T3, T5) of the non-raised portions are included in a range of approximately 10 nanometers to approximately 700 nanometers.

In a sixth implementation, alone or in combination with one or more of the first through fifth implementations, forming the dielectric layer 314 includes forming the dielectric layer 314 over the gate structure 232 and over the first source/drain region 228*a*.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, a high voltage transistor may include a stepped dielectric layer between a field plate structure and a channel region of the high voltage transistor in a substrate. The stepped dielectric layer may increase the breakdown voltage of the high voltage transistor by reducing the electric field strength near the drain region of the high voltage transistor. In particular, a portion of the stepped dielectric layer near the drain region includes a thickness that is greater relative to a thickness of another portion of the stepped dielectric layer near the gate structure. The increased thickness near the drain region provides increased electric field suppression near the drain region (which operates at high voltages). In this way, the stepped dielectric layer enables the high voltage transistor described herein to achieve higher breakdown voltages without increasing the distance between the gate structure and the drain region of a high voltage transistor. This enables the performance of the high voltage transistor to be increased while enabling increased density of high voltage transistors in a semiconductor device.

As described in greater detail above, some implementations described herein provide a semiconductor device. The semiconductor device includes a first source/drain region in a substrate. The semiconductor device includes a second source/drain region in the substrate. The semiconductor device includes a gate structure over the substrate and between the first source/drain region and the second source/drain region. The semiconductor device includes a dielectric layer over the substrate and between the gate structure and the second source/drain region, where the dielectric layer comprises a raised portion and a plurality of non-raised portions adjacent to the raised portion, wherein a thickness of the raised portion is greater than a thickness of the non-raised portions. The semiconductor device includes a field plate layer that extends along the dielectric layer, where a shape of the field plate layer conforms to a profile of the dielectric layer.

As described in greater detail above, some implementations described herein provide a method. The method includes forming a gate structure over a substrate of a semiconductor device. The method includes forming a first source/drain region in the substrate, where the first source/drain region is on a first side of the gate structure. The method includes forming a second source/drain region in the substrate, where the second source/drain region is on a second side of the gate structure opposing the first side. The method includes forming a dielectric layer over the substrate between the gate structure and the second source/drain region. The method includes forming a masking layer over a portion of the dielectric layer. The method includes etching the dielectric layer based on the masking layer, where the masking layer protects the portion of the dielectric layer from being etched, and where etching the dielectric layer based on the masking layer results in the portion of the dielectric layer being a raised portion that is located between non-raised portions of the dielectric layer. The method includes removing the masking layer after etching the dielectric layer based on the masking layer. The method includes forming a field plate layer that extends along the dielectric layer after removing the masking layer.

As described in greater detail above, some implementations described herein provide a semiconductor device. The semiconductor device includes a first source/drain region in a substrate. The semiconductor device includes a second source/drain region in the substrate. The semiconductor device includes a gate structure over the substrate and between the first source/drain region and the second source/drain region. The semiconductor device includes a dielectric layer over the substrate and between the gate structure and the second source/drain region, where the dielectric layer includes an angled portion over a sidewall of the gate structure a non-raised portion connected to the angled portion and approximately parallel with the substrate a raised portion connected to the non-raised portion at a first side of the raised portion, where the raised portion has a top surface that is at a height in the semiconductor device that is greater relative to a height of a top surface of the non-raised portion a stair stepped portion connected to the raised portion at a second side of the raised portion opposing the first side. The semiconductor device includes a field plate layer extends along the angled portion, the non-raised portion, and a portion of the raised portion of the dielectric layer. A top surface of a raised portion of the field plate layer is higher than a top surface of a non-raised portion of the field plate layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
 forming a gate structure over a substrate of a semiconductor device;
 forming a first source/drain region in the substrate, wherein the first source/drain region is on a first side of the gate structure;
 forming a second source/drain region in the substrate, wherein the second source/drain region is on a second side of the gate structure opposing the first side;
 forming a dielectric layer over the substrate between the gate structure and the second source/drain region;
 forming a masking layer over a portion of the dielectric layer;
 etching the dielectric layer based on the masking layer, wherein the masking layer protects the portion of the dielectric layer from being etched, and wherein etching the dielectric layer based on the masking layer results in the portion of the dielectric layer being a raised portion that is located between non-raised portions of the dielectric layer;
 removing the masking layer after etching the dielectric layer based on the masking layer; and
 forming a field plate layer that extends along the dielectric layer after removing the masking layer.

2. The method of claim 1, further comprising:

forming a blocking layer on the substrate between the gate structure and the second source/drain region, wherein forming the dielectric layer comprises:

forming the dielectric layer on the blocking layer.

3. The method of claim 2, wherein forming the dielectric layer comprises:

forming a stair stepped portion of the dielectric layer on the substrate adjacent to an end of the blocking layer.

4. The method of claim 2, wherein forming the dielectric layer comprises:

forming a stair stepped portion of the dielectric layer on the second source/drain region adjacent to an end of the blocking layer.

5. The method of claim 4, wherein forming the dielectric layer comprises:

forming the dielectric layer such that a thickness of the raised portion is included in a range of approximately 10 nanometers to approximately 1000 nanometers.

6. The method of claim 5, wherein etching the dielectric layer comprises:

etching the dielectric layer such that a thickness of the non-raised portions are included in a range of approximately 10 nanometers to approximately 700 nanometers.

7. The method of claim 1, wherein forming the dielectric layer comprises:

forming the dielectric layer over the gate structure and over the first source/drain region.

8. A method of forming a semiconductor device, comprising:

forming a first source/drain region in a substrate;

forming a second source/drain region in the substrate;

forming a gate structure over the substrate and between the first source/drain region and the second source/drain region;

forming a dielectric layer over the substrate and between the gate structure and the second source/drain region, wherein the dielectric layer comprises a raised portion and a plurality of non-raised portions adjacent to the raised portion, wherein a thickness of the raised portion is greater than a thickness of the non-raised portions; and forming a field plate layer that extends along the dielectric layer, wherein a shape of the field plate layer conforms to a profile of the dielectric layer.

9. The method of claim 8, wherein the semiconductor device comprises a high voltage lateral diffused metal oxide semiconductor (LDMOS) transistor; and wherein the dielectric layer is over a portion of a channel region of the LDMOS transistor between the gate structure and the second source/drain region.

10. The method of claim 8, wherein the dielectric layer further comprises:

an angled portion that extends along a sidewall of the gate structure, wherein the angled portion is connected to one of the non-raised portions, and wherein the one of the non-raised portions is approximately parallel with the substrate.

11. The method of claim 10, wherein a width of the one of the non-raised portions is included in a range of approximately 50 nanometers to approximately 5000 nanometers.

12. The method of claim 10, wherein a thickness of the one of the non-raised portions is included in a range of approximately 10 nanometers to approximately 700 nanometers.

13. The method of claim 10, wherein the field plate layer comprises:

an angled portion on the angled portion of the dielectric layer;

a non-raised portion on the one of the non-raised portions of the dielectric layer; and a raised portion on the raised portion of the dielectric layer; and a contact over the raised portion of the field plate layer.

14. The method of claim 8, wherein a thickness of the raised portion is included in a range of approximately 10 nanometers to approximately 1000 nanometers.

15. A method of forming a semiconductor device, comprising:

forming a first source/drain region in a substrate;

forming a second source/drain region in the substrate;

forming a gate structure over the substrate and between the first source/drain region and the second source/drain region;

forming a dielectric layer over the substrate and between the gate structure and the second source/drain region, wherein the dielectric layer comprises:

an angled portion over a sidewall of the gate structure;

a non-raised portion connected to the angled portion and approximately parallel with the substrate;

a raised portion connected to the non-raised portion at a first side of the raised portion, wherein the raised portion has a top surface that is at a height in the semiconductor device that is greater relative to a height of a top surface of the non-raised portion; and a stair stepped portion connected to the raised portion at a second side of the raised portion opposing the first side; and forming a field plate layer that extends along the angled portion, the non-raised portion, and a portion of the raised portion of the dielectric layer, wherein a top surface of a raised portion of the field plate layer is higher than a top surface of a non-raised portion of the field plate layer.

16. The method of claim 15, wherein forming the stair stepped portion comprises:

forming a first stepped portion having a top surface that is approximately co-planar with the top surface of the non-raised portion; and forming a second stepped portion having a top surface that is at a height in the semiconductor device that is less than a height of the top surface of the first stepped portion.

17. The method of claim 16, further comprising:

forming a contact over the raised portion of the field plate layer.

18. The method of claim 16, wherein the raised portion of the field plate layer is over the raised portion of the dielectric layer.

19. The method of claim 15, further comprising:

forming a blocking layer on the substrate between the gate structure and the second source/drain region, wherein the dielectric layer is included on the blocking layer.

20. The method of claim 19, wherein the stair stepped region comprises:

a first stepped portion on the blocking layer; and a second stepped portion adjacent to the blocking layer.

* * * * *